(12) United States Patent
Dip

(10) Patent No.: US 12,180,589 B2
(45) Date of Patent: Dec. 31, 2024

(54) SHOWERHEAD FOR PROCESS TOOL

(71) Applicant: Tokyo Electron Limited, Tokyo (JP)

(72) Inventor: Anthony Dip, Cedar Creek, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 491 days.

(21) Appl. No.: 17/316,316

(22) Filed: May 10, 2021

(65) Prior Publication Data

US 2021/0404064 A1  Dec. 30, 2021

Related U.S. Application Data

(60) Provisional application No. 63/043,394, filed on Jun. 24, 2020.

(51) Int. Cl.
| | |
|---|---|
| C23C 16/455 | (2006.01) |
| B05B 1/18 | (2006.01) |
| C23C 16/24 | (2006.01) |
| C23C 16/458 | (2006.01) |
| C23C 16/52 | (2006.01) |
| H01L 21/02 | (2006.01) |
| H01L 21/66 | (2006.01) |

(52) U.S. Cl.
CPC ........ *C23C 16/45565* (2013.01); *B05B 1/185* (2013.01); *C23C 16/24* (2013.01); *C23C 16/45553* (2013.01); *C23C 16/4584* (2013.01); *C23C 16/52* (2013.01); *H01L 21/02532* (2013.01); *H01L 21/0262* (2013.01); *H01L 22/20* (2013.01)

(58) Field of Classification Search
CPC .......... C23C 16/45565; C23C 16/4558; C23C 16/45544; C23C 16/455; C23C 16/45591; C23C 16/52; H01J 37/32449; H01J 37/3244

See application file for complete search history.

(56) References Cited

U.S. PATENT DOCUMENTS

| | | | |
|---|---|---|---|
| 9,540,731 B2 * | 1/2017 | Noorbakhsh | C23C 16/45565 |
| 10,378,107 B2 | 8/2019 | Chandrasekharan et al. | |
| 2008/0099145 A1 * | 5/2008 | Keller | C23C 16/45591 118/733 |
| 2009/0061083 A1 | 3/2009 | Chiang et al. | |
| 2009/0218317 A1 | 9/2009 | Belen et al. | |
| 2011/0162800 A1 * | 7/2011 | Noorbakhsh | H01J 37/32091 239/289 |
| 2013/0315795 A1 * | 11/2013 | Bera | H01J 37/3244 422/310 |

(Continued)

FOREIGN PATENT DOCUMENTS

TW   I398547 B   6/2013

*Primary Examiner* — Edward Chin
(74) *Attorney, Agent, or Firm* — Slater Matsil, LLP

(57) ABSTRACT

In one example, an apparatus includes a processing chamber; a substrate holder disposed in the processing chamber; and a showerhead disposed over the substrate holder. The showerhead includes a first zone disposed in a central region of the showerhead, the first zone including a first cavity, a plurality of first fluid exit holes aligned to output a fluid from the first cavity towards the substrate holder, a first flow path fluidly coupled to a fluid source, and a plurality of first fluid distribution pathways fluidly coupling the first flow path with the first cavity.

24 Claims, 15 Drawing Sheets

(56) References Cited

U.S. PATENT DOCUMENTS

| | | | |
|---|---|---|---|
| 2016/0169593 A1* | 6/2016 | Bera | F28F 3/12 |
| | | | 165/80.1 |
| 2016/0376706 A1* | 12/2016 | Miller | H01L 21/67017 |
| | | | 239/565 |
| 2020/0255943 A1* | 8/2020 | Miller | H01L 21/67017 |
| 2021/0404064 A1* | 12/2021 | Dip | H01L 21/02532 |

* cited by examiner

# SHOWERHEAD FOR PROCESS TOOL

CROSS-REFERENCE TO RELATED APPLICATIONS

This application claims the benefit of U.S. Provisional Application No. 63/043,394, filed on Jun. 24, 2020, which application is hereby incorporated herein by reference.

TECHNICAL FIELD

The present invention relates generally to semiconductor fabrication process equipment and, in particular embodiments, to a showerhead for a process tool.

BACKGROUND

A variety of thin films are deposited in the semiconductor industry using deposition processes such as chemical vapor deposition (CVD). In a CVD process, different reactant gases are brought into contact with a surface on which a thin film is deposited. The gases react either thermally as in atmospheric pressure CVD (APCVD) or sub atmospheric CVD (SACVD) or at lower temperatures assisted with electrical energy as in plasma enhanced CVD (PECVD. A CVD process called atomic layer deposition (ALD) is being used to deposit controlled atomic layers of materials.

A variety of thin films are etched in the semiconductor industry using gas phase chemical etching processes with fluid vapors such as hydrogen fluoride, and with gas phase plasma etching processes that use gases such as fluorine containing molecules and chlorine containing molecules to generate highly reactive fluorine and chlorine atoms. Atomic layer etching (ALE) uses highly reactive gaseous reactants to etch the surface of thin films one atomic layer at a time.

As illustrated in FIGS. 1A and 1B, reactant fluids for thin film deposition or thin film etching are dispensed through fluid exit holes 102 in a showerhead 100 above a substrate 112 such as a semiconductor wafer in the deposition or etching tool.

FIG. 1A is top view of a single wafer deposition or etching tool 116 and illustrates a top down view of a showerhead 100 above the substrate holder 110 (without showing the substrate). An exhaust port 118 surrounding the showerhead 100 removes the fluid that emerges from the fluid exit holes 102.

FIG. 1B is a cross-sectional view of the showerhead 100 in FIG. 1A. A fluid (gas) path 106 couples the showerhead 100 to a fluid source 108. The fluid path 106 delivers the fluid into a cavity 104 within the showerhead 100. Fluid exit holes 102 are aligned to output the fluid from the cavity towards a substrate 112 on the substrate holder 110.

FIG. 2 is a top view of a batch deposition or etching tool 122. Substrates 112 such as semiconductor wafers are positioned near the circumference of a substrate holder 124. The substrate holder 124 rotates the substrates 112 under a wedge-shaped reactant showerhead 126 during CVD or ALD deposition or during chemical vapor, plasma or ALE etching. An inert gas such as nitrogen is dispensed from wedge-shaped inert gas showerheads 128 on both sides of the wedge-shaped reactant showerhead 126. Nitrogen emerging from the wedge-shaped inert gas showerheads 128 and fluid emerging from the wedge-shaped reactant showerhead 126 are removed through exhaust port 120.

SUMMARY

In accordance with an embodiment, an apparatus includes a processing chamber; a substrate holder disposed in the processing chamber; and a showerhead disposed over the substrate holder. The showerhead includes a first zone disposed in a central region of the showerhead, the first zone including a first cavity, a plurality of first fluid exit holes aligned to output a fluid from the first cavity towards the substrate holder, a first flow path fluidly coupled to a fluid source, and a plurality of first fluid distribution pathways fluidly coupling the first flow path with the first cavity.

In accordance with an embodiment, an apparatus includes a processing chamber; a substrate holder disposed in the process chamber, where the substrate holder is configured to support a plurality of wafers; and a showerhead system disposed over the substrate holder. The showerhead system includes a wedge-shaped showerhead disposed around a central region of the processing chamber. The wedge-shaped showerhead includes a first cavity in a central zone of the wedge-shaped showerhead, a plurality of first fluid exit holes aligned to output a fluid from the first cavity towards the substrate holder, a plurality of fluid distribution pathways exiting into the first cavity, and a first flow path fluidly coupling a fluid source with the plurality of fluid distribution pathways.

In accordance with an embodiment, a method of processing a substrate includes flowing a gas through a showerhead towards the substrate. The showerhead includes a first zone disposed in a central region of the showerhead, the first zone including a first cavity, a plurality of first fluid exit holes aligned to output a fluid from the first cavity towards the substrate, a first flow path fluidly coupled to a fluid source, and a plurality of first fluid distribution pathways fluidly coupling the first flow path with the first cavity. The flowing includes filling the first cavity with the gas through the first flow path and the plurality of first fluid distribution pathways and directing the gas to exit from the first cavity through the plurality of first fluid exit holes.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A-3B is a showerhead with fluid distribution pathways for a single wafer deposition or etching tool in accordance with an embodiment, wherein FIG. 3A is a top view and FIG. 3B is a cross sectional view of FIG. 3A;

FIGS. 4A-4B is a showerhead with fluid distribution pathways for a single wafer deposition or etching tool in accordance with an embodiment, wherein FIG. 4A is a top view and FIG. 4B is a cross sectional view of FIG. 4A;

FIG. 5A is a multi-zone showerhead with fluid distribution pathways for a single wafer deposition or etching tool in accordance with an embodiment, wherein FIG. 5A is a top view and FIG. 5B is a cross sectional view of FIG. 5A;

FIG. 6A is a top view of a batch deposition or etching tool with a wedge-shaped showerhead with fluid distribution pathways in accordance with an embodiment, wherein FIG. 6A illustrates a top view of the batch deposition or etching tool.

FIG. 7A is a wedge-shaped, multi-zone showerhead with fluid distribution pathways for a batch wafer deposition or etching tool in accordance with an embodiment, wherein FIG. 7A is a plan view and FIG. 7B is a cross sectional view of FIG. 7A;

FIG. 8A is a wedge-shaped, multi-zone showerhead in FIG. 7A with a skirt in accordance with an embodiment, wherein FIG. 8A is top view and FIG. 8B is a cross sectional view of FIG. 8A;

FIG. 12A is a wedge-shaped, multi-zone showerhead in FIG. 7A with a vacuum channel in accordance with an embodiment, wherein FIG. 12A is a top view and FIG. 12B is a cross sectional view of FIG. 12A;

FIG. 13A is a wedge-shaped, multi-zone showerhead in FIG. 8A with a vacuum channel formed in the skirt in accordance with an embodiment, wherein FIG. 13A is a top view and FIG. 13B is a cross sectional view of FIG. 13A.

DETAILED DESCRIPTION OF ILLUSTRATIVE EMBODIMENTS

Depositing thin films with uniform film properties such as thickness, composition, and index of refraction across large substrates such as 300 mm wafers is challenging. For a thin film to be deposited uniformly using a showerhead, the fluid is uniformly dispensed from the fluid exit holes in the showerhead towards the surface of the substrate being processed.

Etching thin films uniformly across a wafer using a vapor etching fluid or gaseous radicals generated in a plasma from a fluid is challenging and generates byproducts that are required to be removed. For a thin film to be etched uniformly using a showerhead, the fluid is dispensed uniformly from the fluid exit holes towards the surface of the thin film being etched. Post deposition or post etch, metrology measurements are made across the wafer and correlation calculations are performed upon the data to determine if a statistically significant thickness pattern is present on the wafer.

Figure 1A:
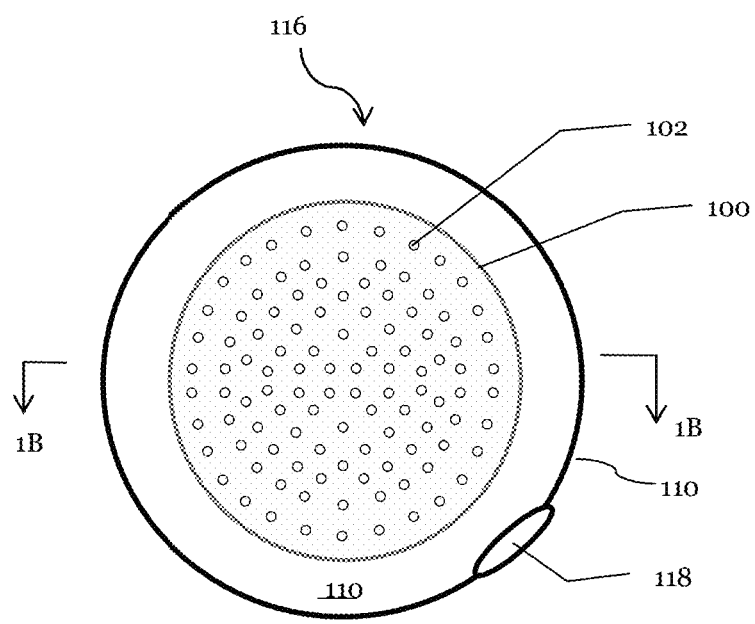
FIG. 1A is a top view of a prior art single wafer showerhead and FIG. 1B is a prior art cross-sectional view of the a single wafer thin film deposition or thin film etching tool.
Figure 1B:
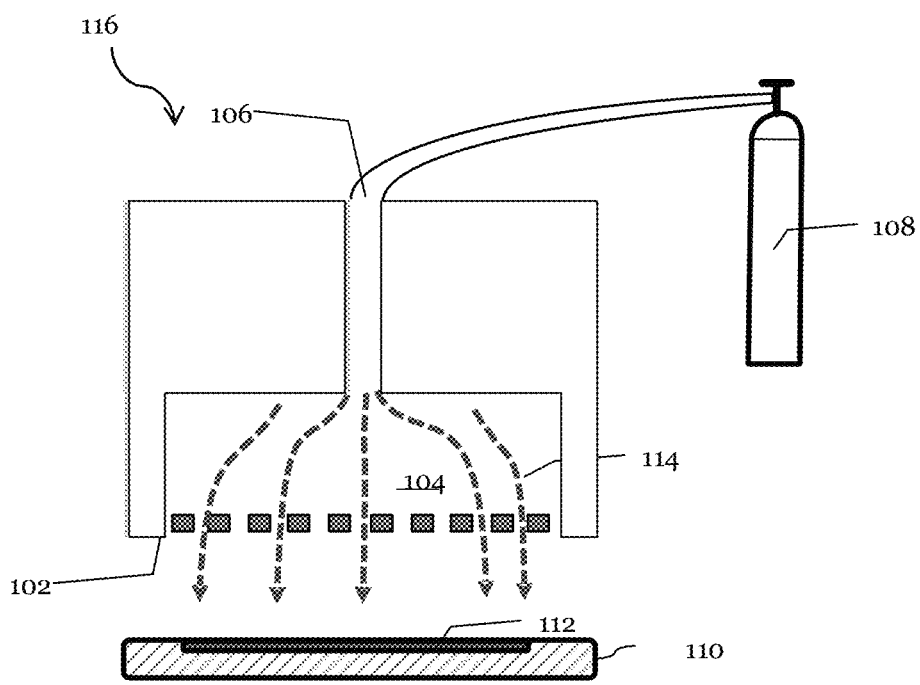
Figure 2:
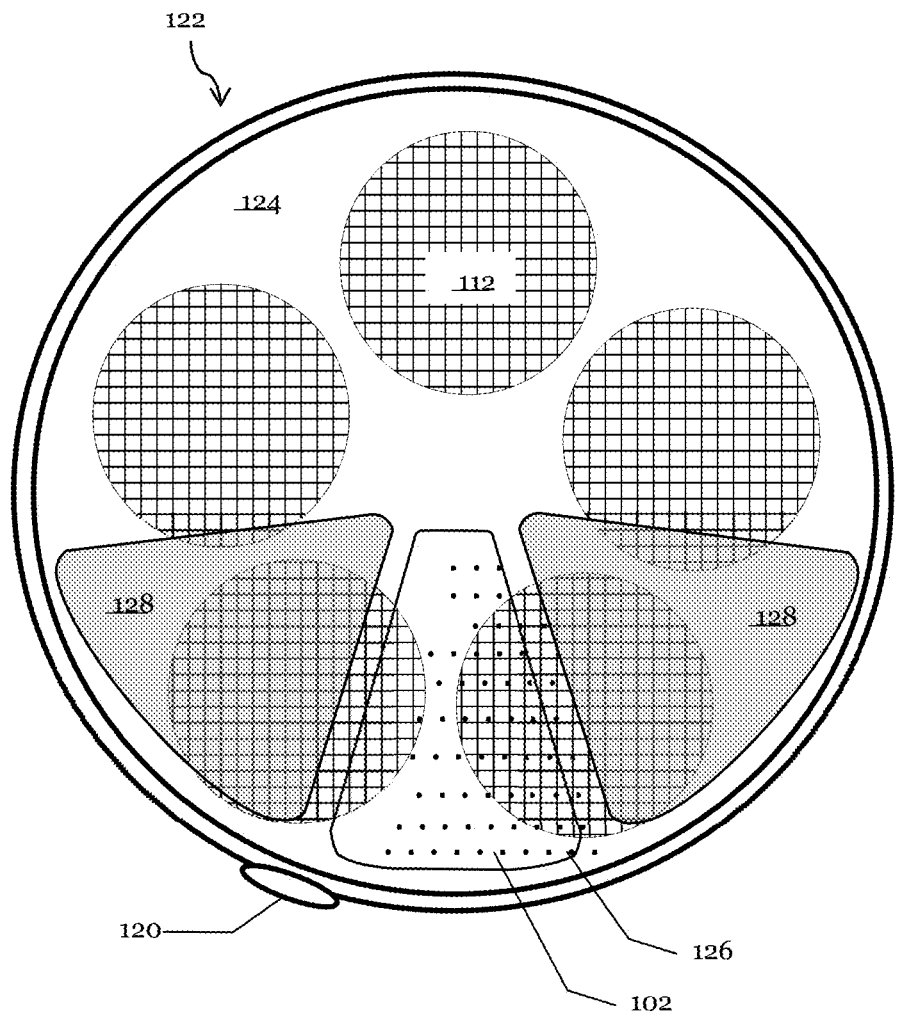
FIG. 2 is a top view of a prior art batch CVD deposition or thin film etching tool with a wedge-shaped showerhead.

For the fluid to leave the fluid exit holes uniformly, the fluid pressure above the holes has to be uniform. The fluid pressure within the cavity has to be sufficiently high for the fluid pressure above all the fluid exit holes to be the same. In prior art designs as illustrated in FIGS. 1-2, as the size of the substrate gets larger, the showerhead also gets larger and the size of the cavity gets larger. To keep the fluid pressure within the cavity uniform across the increased number of fluid exit holes, the fluid pressure, fluid temperature, and fluid flow (flow rate) is increased. The higher fluid flow results in increased fluid usage resulting in increased fluid cost and increased post processing costs of the chemicals after processing. The increased usage of the fluids, especially in the case of expensive precursor fluids such as those used in atomic layer depositions (ALD), can significantly increase fabrication costs.

Embodiments of the present disclosure enable deposition and etching of thin films uniformly by changing the design of the showerhead as will be described in more detail below. In accordance with an embodiment, an apparatus comprises a showerhead with fluid distribution pathways for uniform deposition and for the reduction in the amount of fluid the process uses. In accordance with an embodiment, an apparatus comprises a wedge-shaped showerhead with fluid distribution pathways for uniform deposition and uniform etching while using less fluid. In accordance with an embodiment, a method for deposition or etching comprises flowing a fluid through fluid distribution pathways and filling a cavity within a wedge-shaped showerhead with uniform pressure.

Figure 3A:
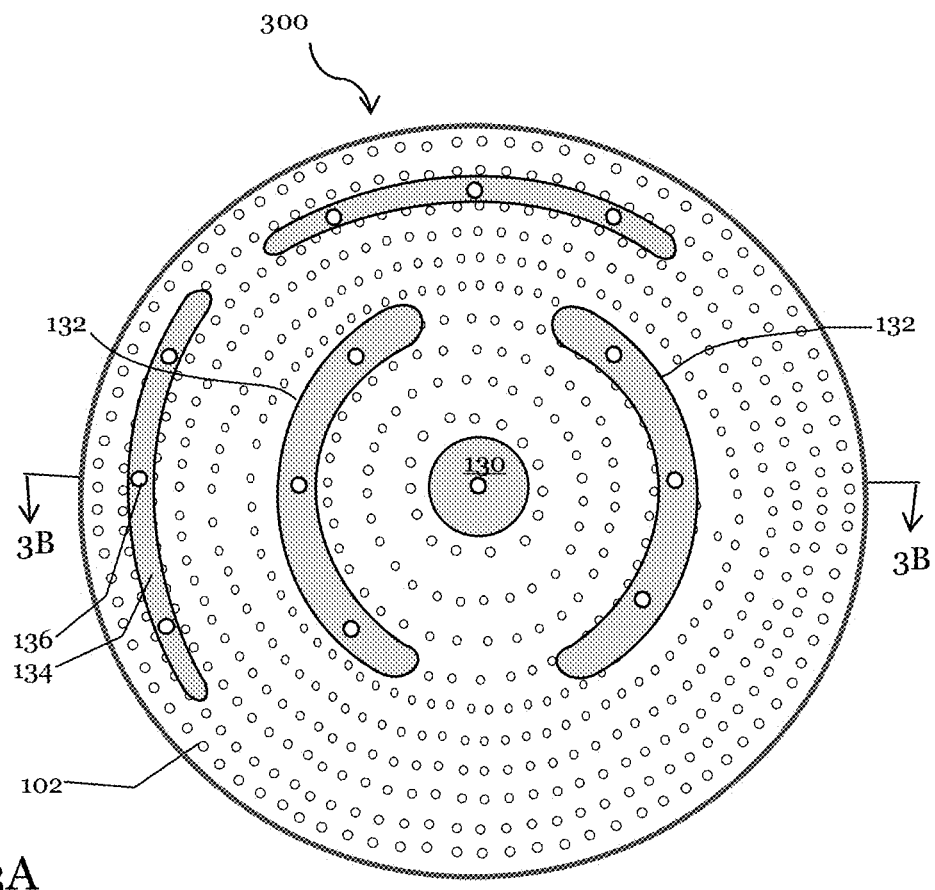
Figure 3B:
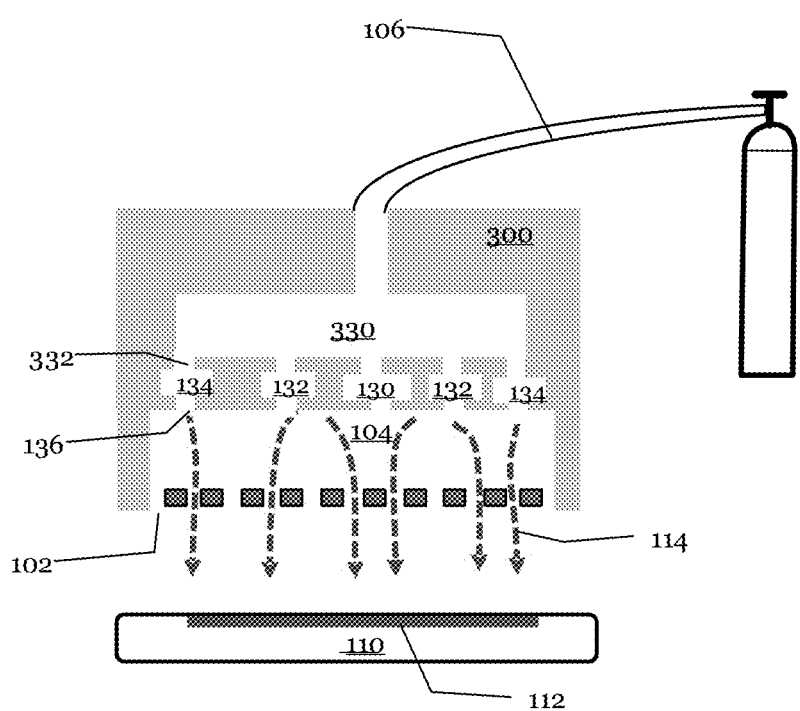

FIGS. 3A and 3B are a top view and a cross sectional view of a single wafer deposition or etching showerhead according to an example embodiment.

The showerhead 300 includes a body portion, e.g., made of stainless steel or other metal depending upon the corrosive properties of the fluid. Within the body portion is a hollow cavity 104 with fluid exit holes 102 through which the fluid exits the cavity 104. The fluid exit holes 102 uniformly cover the side of the showerhead 300 that faces the substrate 112. A threaded opening on the side of the showerhead 300 opposite the fluid exit holes 102 permits connection to a fluid source 108. Fluid from the fluid source 108 fills the cavity 104 and is dispensed through the fluid exit holes 102 toward the substrate 112. When the pressure of the fluid inside the showerhead 300 is sufficiently high, the pressure across the fluid exit holes 102 is virtually the same for all the fluid exit holes 102. The pressure required to equalize the flow rate through the fluid exit holes 136 within a showerhead 300 depends upon the volume of the cavity 104 in the showerhead 300. A lower pressure can be used to equalize the flow rate when the cavity 104 is smaller. In an arrangement where the cavity 104 volume is about 150 $cm^{-3}$ to 200 $cm^{-3}$, e.g., 175 $cm^{-3}$, a minimum pressure of about 1 Torr to 2 Torr above the chamber pressure can be used, for example by setting the pressure between about 1.6 Torr to about 2.6 Torr if the chamber pressure is about 0.5 Torr to about 0.8 Torr, e.g., 0.6 Torr.

The variation in pressure across the fluid exit holes 102 may be between 0.1% to 1% in one embodiment, and less than 5% in various embodiments. This ensures the amount of fluid being dispensed through each fluid exit hole 102 is virtually the same so that during a deposition process composition and thickness of a film being deposited is uniform across the wafer or during an etching process the thickness of the film being etched is uniform across the wafer.

Illustrated in FIG. 3A and FIG. 3B is a showerhead 300 with multiple fluid distribution pathways 130, 132, and 134 and with multiple fluid distribution holes 136. As one example, the showerhead 300 in FIG. 3A has four fluid distribution pathways 134 with twelve fluid distribution holes 136 around the periphery region of the showerhead 300, two fluid distribution pathways 132 with six fluid distribution holes 136 in the intermediate (donut) region of the showerhead 300 and one fluid distribution pathway 130 with one fluid distribution hole 136 in the center of the showerhead 300. This arrangement delivers more fluid to the outer region of the showerhead 300 where the most fluid is being dispensed, an intermediate amount of fluid to the donut portion of the showerhead 300 where an intermediate amount of fluid is being dispensed, and the least amount of fluid to the center of the showerhead 300 where the least amount of fluid is being dispensed. By delivering more fluid to where more fluid is needed, virtually the same amount of fluid can be dispensed from all the fluid exit holes 102 while maintaining a lower pressure.

Accordingly, embodiments of the present disclosure improve deposition processes such as chemical vapor deposition (CVD) and atomic layer deposition (ALD), e.g., improving thin film deposition uniformity while reducing cost. In addition, embodiments of the present disclosure improve etching uniformity while generating a reduced amount of hazardous byproducts. Since there are many more fluid exit holes 102 in the periphery region of the showerhead than in the center of the showerhead 300, significantly more fluid flows out through the periphery than flows out of the middle and center regions of the showerhead 300. In contrast, conventional showerheads have one fluid path 106 with one centrally located fluid distribution outlet to provide fluid throughout fluid cavity 104 (FIG. 1B).

As described previously, when fluid is dispensed from a showerhead such as a conventional showerhead at a higher pressure, significantly more fluid flows, and therefore significantly more fluid is used during a deposition or etching step, generating significantly more exhaust gases, which have to be processed as well. Compared to the conventional design, not only less amount of fluid is being used but also less effort is needed for cleaning the waste products. In addition, when fluid is dispensed from a showerhead at a higher pressure, the showerhead has be positioned at a greater distance from the substrate 112 to avoid the showerhead hole pattern from being imprinted on the deposited or etched thin film (process defects). Embodiments of the present application avoid the post-processing costs and process defects design issues associated with conventional designs by controlling the outflow of reactants from the showerhead 300 to flow more uniformly.

Accordingly, in various embodiments, the use of showerhead 300 with fluid distribution pathways 130, 132, and 134 improves the deposited or etched thin film across wafer uniformity, reduces the cost of fluid, and reduces byproduct removal costs.

The fluid distribution pathways 130, 132, and 134 are coupled to the fluid source 108 storing a fluid to be distributed onto the substrate 112. Additional components such as pumps, flow valves, control circuitry, and other standard equipment are not illustrated for clarity. The fluid distribution pathways 130, 132, and 134 are mini cavities in that they store the fluid but have a smaller volume than the cavity 104. By adding, a layer of fluid distribution pathways 130, 132, and 134 above the cavity 104 with multiple fluid distribution holes 136 from the fluid distribution pathways 130, 132, and 134 into the cavity 104, the fluid distribution pathways 130, 132, and 134 help to maintain a more uniform fluid pressure within the cavity 104 Maintaining uniform fluid pressure within the cavity 104 at a lower pressure enables a smaller cavity 104 to be used and enables a reduced fluid flow rate to be used while maintaining uniform pressure above all the fluid exit holes 102. The uniform pressure dispenses the fluid 114 uniformly through all the fluid exit holes 102. Even with a lower fluid flow rate, the fluid distribution pathways 130, 132, and 134 enable a uniform pressure to be maintained within a smaller cavity 104. This is because more fluid is entering the peripheral regions due to the larger number of fluid distribution holes 136 located in the ceiling of the peripheral regions of the cavity 104.

Figure 4A:
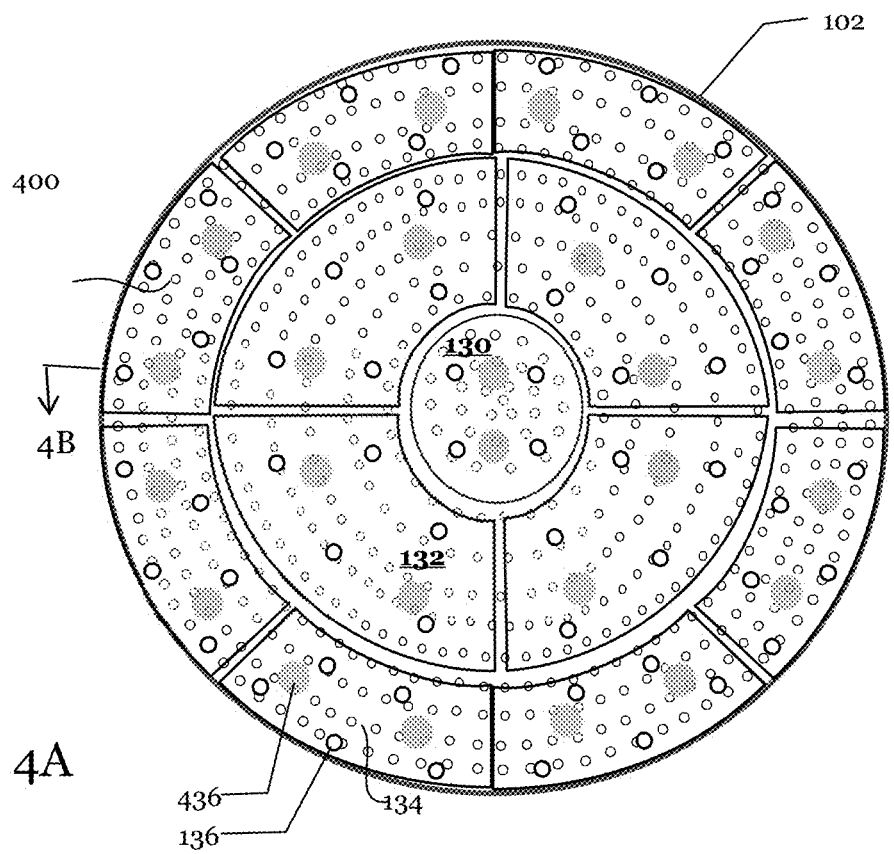
Figure 4B:
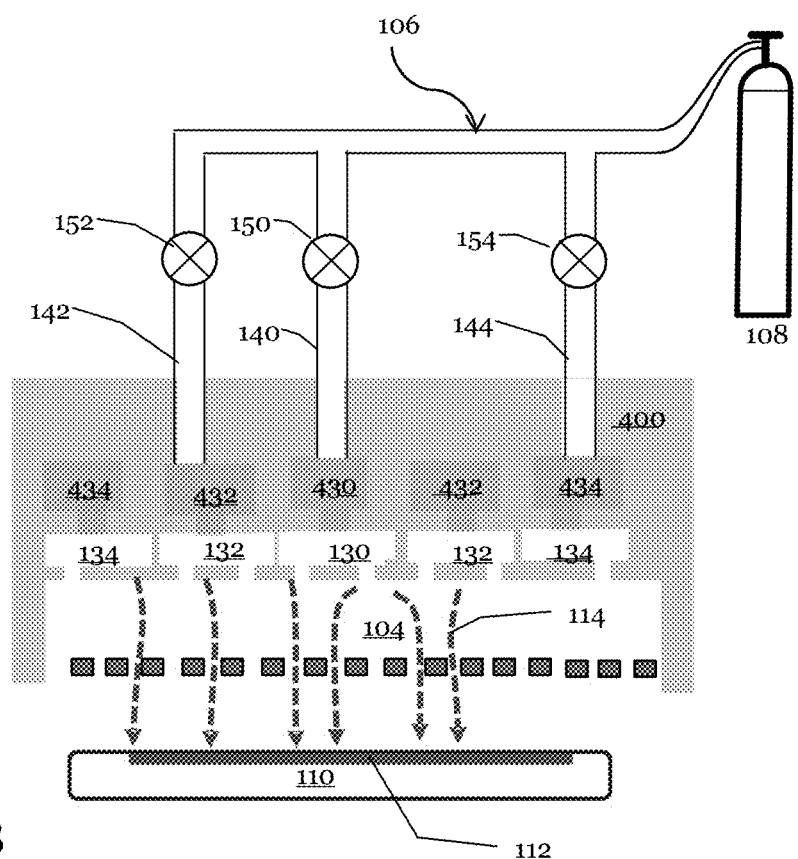

FIGS. 4A-4B is a showerhead with fluid distribution pathways for a single wafer deposition or etching tool in accordance with an embodiment, wherein FIG. 4A is a top view and FIG. 4B is a cross sectional view of FIG. 4A.

FIGS. 4A-4B illustrate a further embodiment with multiple levels of fluid distribution paths. In certain embodiments, the additional fluid distribution pathways 430, 432, and 434 may be positioned above the fluid distribution pathways 130, 132, and 134 to improve the uniformity further. Thus more of the fluid may be distributed towards the peripheral regions of the cavity 104, for example, by using more fluid distribution pathways 130, 132, and 134 with a greater number of fluid distribution holes 136 located in the peripheral regions. In FIG. 4A, in one example, eight fluid distribution pathways 134 with forty fluid distribution holes 136 provide fluid to the peripheral regions of the showerhead 400. Four fluid distribution pathways 132 with twenty fluid distribution holes 136 provide fluid to the intermediate (doughnut) region of the showerhead 400. One fluid distribution pathway 130 with four fluid distribution holes 136 provides fluid to the central region of the showerhead 400. By providing multiple fluid distribution pathways, 130, 132, and 134, each with a similar number of fluid distribution holes 136 covering the ceiling of the cavity 104, a uniform fluid flow can be maintained across the fluid exit holes 102 using a lower pressure.

To provide uniform fluid flow from the fluid source 108 to each of the thirteen distribution pathways in the arrangement in FIG. 4A, an additional layer of upper fluid distribution pathways 430, 432, and 434 distribute the fluid uniformly into the underlying layer of fluid distribution paths 130, 132, and 134 through upper fluid distribution holes 436. The upper layer of fluid distribution pathways 430, 432, and 434 can be connected to the fluid source 108 through separate conduits, 140, 142, and 144. Valves 150, 152, and 154 such as mass flow controller valves can independently provide precise control of the fluid flow into each of the upper fluid distribution pathways 430, 432, and 434. Additional levels of fluid distribution pathways can be added to additionally reduce fluid usage by improving the uniformity of fluid dispensed from the fluid exit holes 102 at a lower pressure. This adds complexity and cost to the showerhead 400. A model showing a correlation the number of fluid distribution pathways versus costs versus film uniformity can be used to determine optimal balance of these variables.

Figure 5A:
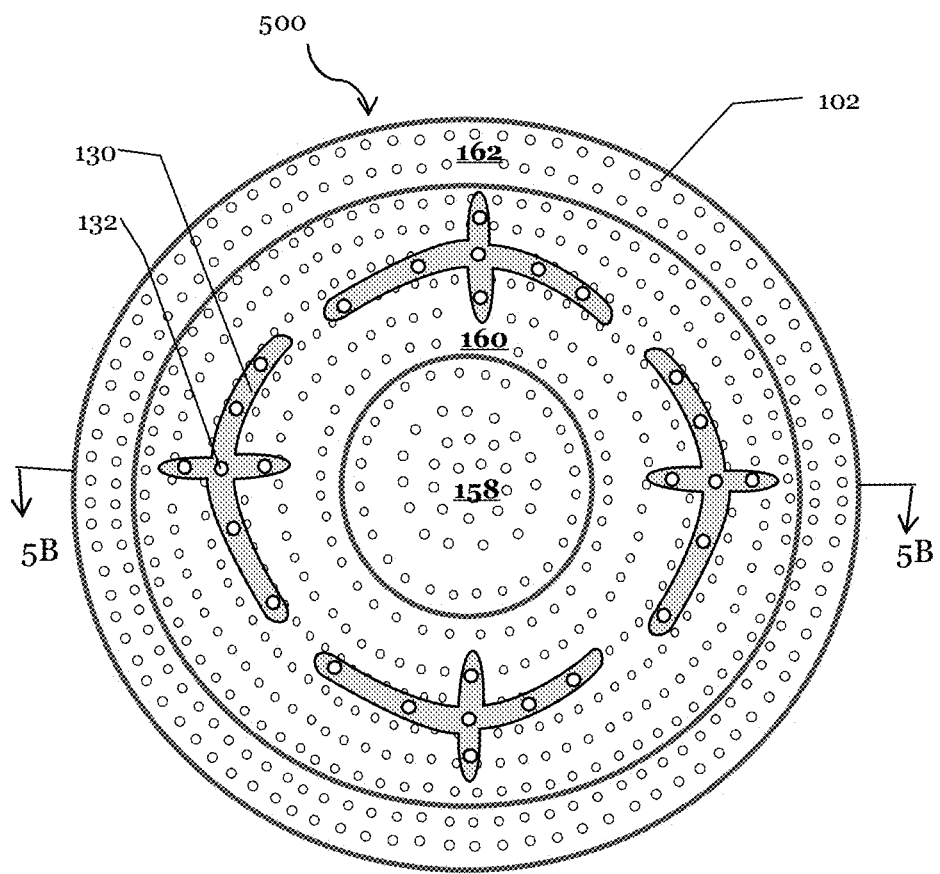
Figure 5B:
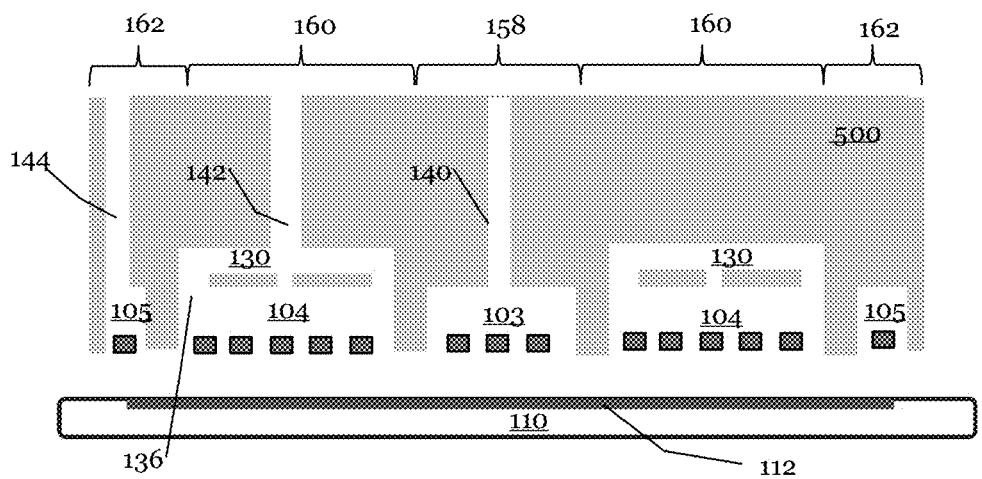

FIG. 5A is a multi-zone showerhead 500 with fluid distribution pathways 130 and fluid distribution holes 136 for a single wafer deposition or etching tool in accordance with an embodiment, wherein FIG. 5A is a top view and FIG. 5B is a cross sectional view of FIG. 5A.

As illustrated in the above arrangements, a single-wafer showerhead can have more than one zone from which the fluid is dispensed and to which the fluid mixture and flow rate can be independently controlled. Each zone can have more than one fluid distribution pathway to improve the uniformity of the fluid distribution within each zone. In addition, more than one upper layer of fluid distribution pathways above a lower layer of fluid distribution pathways can be provided to improve the uniformly with which the fluid is delivered to the lower level. During the thin film deposition or etching, the target film uniformity across the substrate can be maintained by adjusting the value of the one or more operating variables affecting the showerhead; the operating variables comprising chamber temperature, the fluid flow rate of input fluids to each zone in the showerhead, the composition of the input fluids to each zone, the chamber fluid pressure in each zone, ratio of fluid flowrate of a first exhaust port compared to a second exhaust port, the number of fluid pathways or number of fluid exit holes that are open in each zone, and/or the pressure of the fluid inside each zone of the showerhead. In conventional single wafer CVD (and ALD) deposition tools and single wafer fluid vapor (and ALE) etching tools (FIGS. 1A and 1B), the fluids are dispensed through the fluid exit holes 102 across the showerhead 100 and are evacuated from the fluid deposition and etching tools through exhaust ports 118 surrounding the showerhead 100. The fluid flows radially across the semiconductor substrate 112 frequently resulting in radial pattern with non-uniform thin film properties. To compensate for this radial non uniformity, showerheads with multiple radial zones such as an inner zone 158, middle zone 160, and an outer zone 162 such as is illustrated in FIGS. 5A and 5B may be used.

To improve radial deposition or etching uniformity, the fluid mixture and flow rate can be independently controlled in each of the fluid paths 140, 142, 144 to each of the inner, middle, and outer zones 158, 160, and 162. As an illustration, the fluid distribution pathways 130 include separate sections oriented in different directions, for example, in one case orthogonal sections. In various embodiments, the cavities 103 and 105 in the inner zone 158 and outer zone 162 are smaller in volume than the cavity 104 in the middle zone 160. While the fluid distribution pathways 130 and fluid distribution holes 136 are of significant benefit to the larger middle zone 160, they may be of less benefit to the smaller inner zone 158 and outer zone 162 and in some embodiments may be omitted from these zones.

Figure 6A:
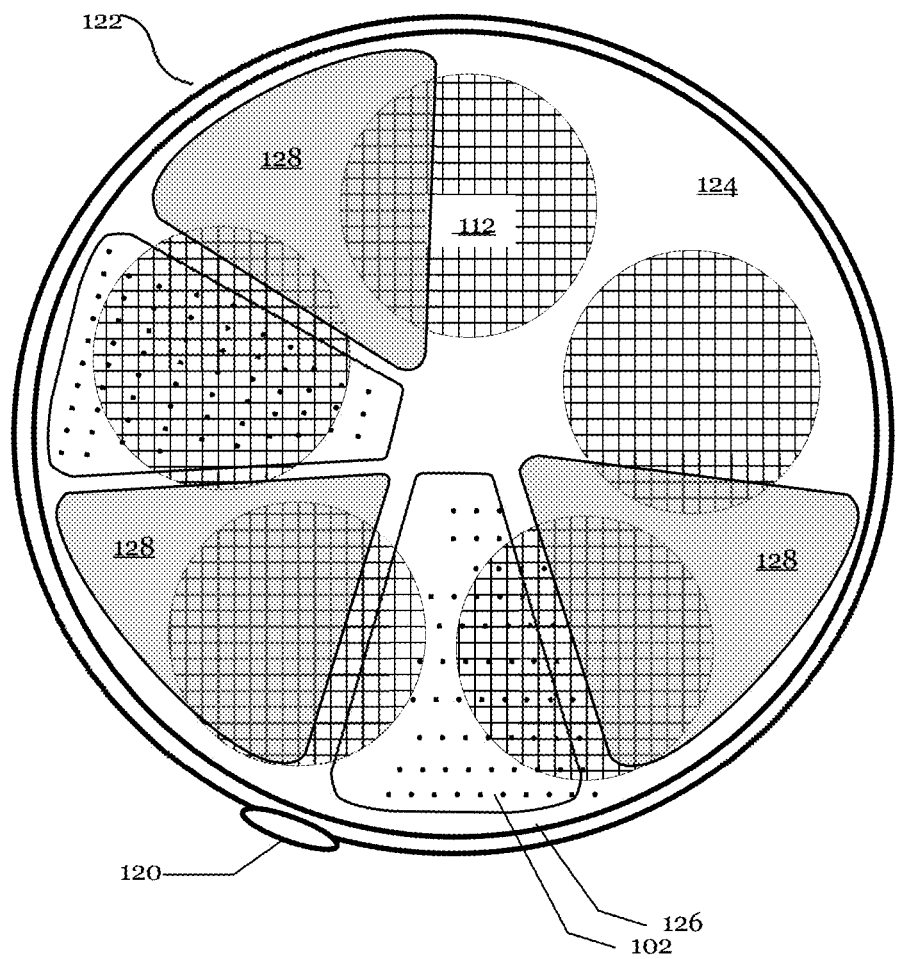
Figure 6B:
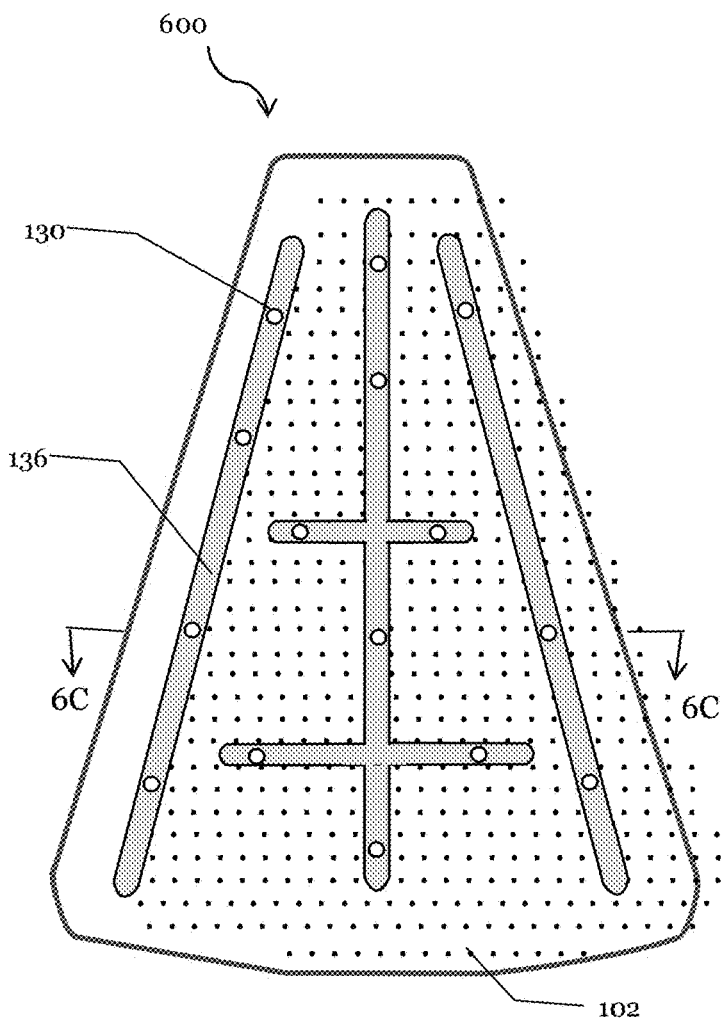
FIG. 6B is a top view of the wedge-shaped showerhead and FIG. 6C is a cross sectional view of FIG. 6B.
Figure 6C:
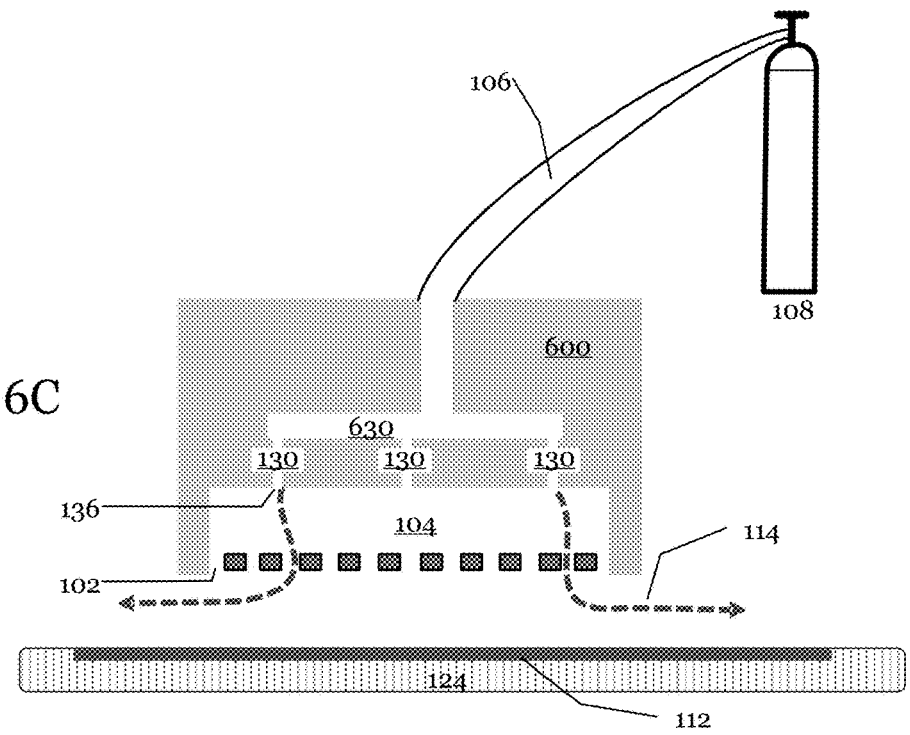

FIG. 6A is a top view of a batch deposition or etching tool with a wedge-shaped showerhead with fluid distribution pathways in accordance with an embodiment, wherein FIG. 6A illustrates a top view of the batch deposition or etching tool, FIG. 6B is a top view of the wedge-shaped showerhead and FIG. 6C is a cross sectional view of FIG. 6B. As further described herein, this example embodiment improves thin film uniformity and reduces fluid cost in batch thin film deposition processes such as CVD and ALD depositions and reduces the costs of removing byproducts in batch thin film etching processes.

Referring to FIG. 6A, the batch thin film deposition or etching tool includes a showerhead system including one or more wedge shaped showerheads 600 disposed in a process chamber. Substrates 112 such as semiconductor wafers are positioned near the circumference of a substrate holder 124. The substrate holder 124 rotates the substrates 112 under one or more wedge shaped showerheads 600 during a deposition or etching process such as CVD or ALD deposition and fluid vapor or ALE etching. An inert gas such as nitrogen is dispensed from wedge-shaped inert gas showerheads 128 on both sides of each of the one or more wedge shaped showerheads 600. Nitrogen emerging from the wedge-shaped inert gas showerheads 128 and fluid emerging from the one or more wedge shaped showerheads 600 are removed through exhaust port 120 (or multiple exhaust ports as will be discussed in further embodiments in FIG. 10) disposed along the perimeter of the substrate holder 124.

Illustrated in the FIG. 6B top view and the FIG. 6C cross sectional view are fluid distribution paths 130 with fluid distribution holes 136 that are coupled to a fluid distribution manifold 630 that distributes the fluid to each of the fluid distribution pathways 130. A fluid path 106 couples the fluid distribution manifold 630 to a fluid source 108. The fluid distribution pathways 130 distribute the fluid uniformly within the cavity 104. Distributing the fluid uniformly enables a smaller cavity 104 and lower fluid flow rate to be used while still maintaining uniform pressure above all fluid exit holes 102. The uniform pressure simultaneously dispenses the fluid 114 uniformly through all the fluid exit holes 102 towards the substrate 112. The substrate holder 124 rotates passing the substrates 112 under the each of the one or more wedge-shaped showerheads 600 during the deposition or etching. As the substrates 112 rotate, fluid emerges from the fluid exit holes 102 and flows out 114 from under each of the one or more wedge-shaped showerheads 600 as is illustrated in FIG. 6C.

Figure 7A:
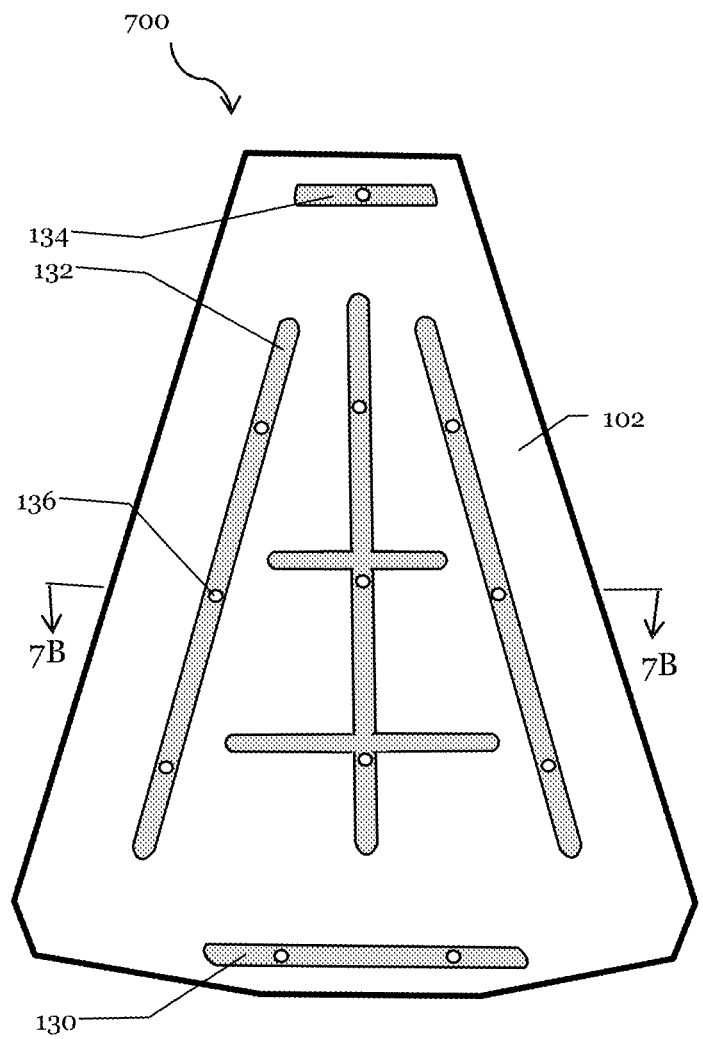
Figure 7B:
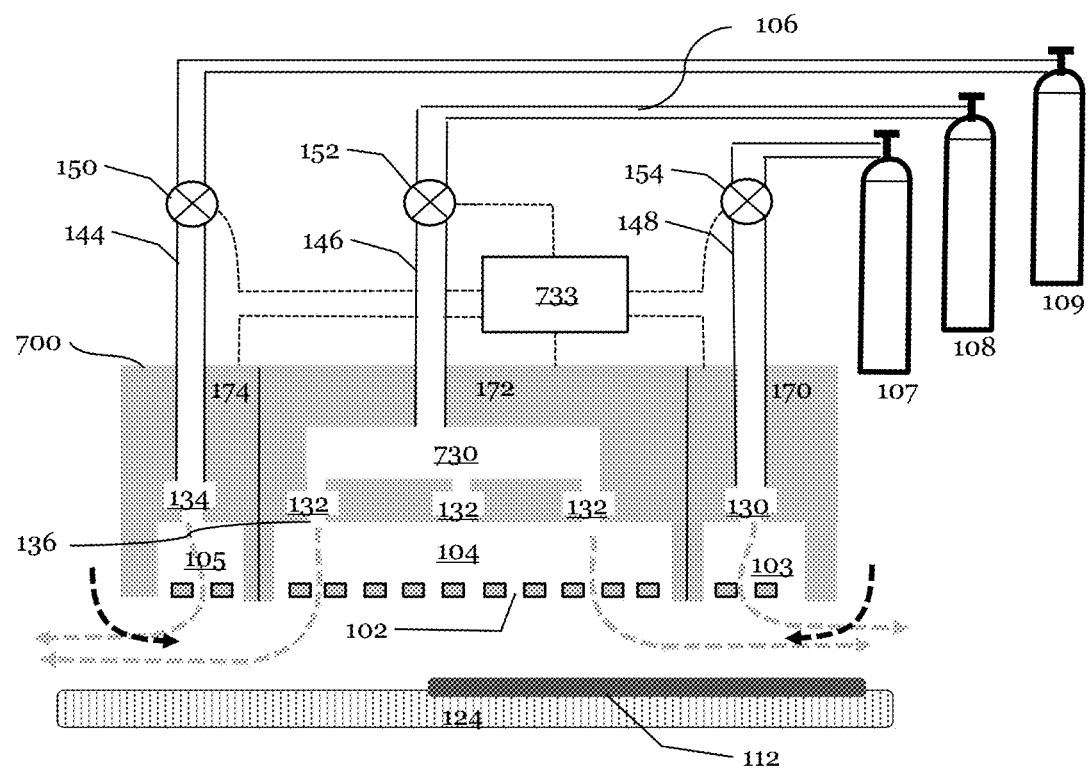

FIG. 7A illustrates a wedge-shaped, multi-zone showerhead with fluid distribution pathways 130, 132, and 134 for a batch wafer deposition or etching tool in accordance with an embodiment, where FIG. 7A is a top view and FIG. 7B is a cross sectional view of FIG. 7A. This embodiment includes multiple zones to further improve radial uniformity across the wafer.

In batch deposition or etching tools such as illustrated in FIGS. 7A and 7B, the fluids 114 are dispensed through the fluid exit holes 102 toward the substrate 112 across the underside of the wedge-shaped showerhead 700. The fluids 114 are evacuated from the batch deposition or etching tool 122 through exhaust ports 164 and 166 (see FIG. 10 discussed below) outside the substrate holder 124. Nitrogen 168 from the ambient surrounding the wedge-shaped showerhead 700 can back diffuse under the edges of the wedge-shaped showerhead 700. Nitrogen 168 back diffusion can dilute the fluid 114 and alter the thin film properties near the borders of the wedge-shaped showerhead 700. This could be especially problematic at the apex 174 and base 170 of the wedge-shaped showerheads 700. Accordingly, in certain embodiments, wedge-shaped showerheads 700 with multiple zones, 170, 172, and 174 with fluid distribution pathways 130, 132, and 134 are used to improve thin film uniformity.

In various embodiments, a different fluid mixture, 107, 108, and 109 can be delivered to each zone 170, 172, and 174. A microprocessor 733 can send signals to valves 150, 152, and 154 in each of the fluid lines to independently adjust the flow rate of each of the fluid mixtures 107, 108, 109 to each of the zones 170, 172, and 174. The microprocessor can send signals to thermal controllers in each of the zones 170, 172, and 174 to independently control the temperature in each of the zones 170, 172, and 174.

In various embodiments, the fluid mixture 107, 108, 109 and the fluid flow rate can be independently controlled by valves 150, 152, and 154 in each of the fluid paths 144, 146, and 148 to each of the zones 170, 172, and 174 respectively. Typically the cavities 103 and 105 in the inner zone 174 and outer zone 170 have significantly less volume than the cavity 104 in the middle zone 172. While the fluid distribution pathways 132 and fluid distribution holes 136 are of significant benefit to the larger middle zone 172, fluid distribution pathway 134 may be of less benefit to the smaller inner zone 174 and fluid distribution pathway 130 may be of less benefit to the smaller outer zone 170. In some multi-zone showerheads the inner fluid distribution pathways 130 and outer fluid distribution pathways 134 can be omitted.

As is illustrated in the above arrangements, a wedge-shaped showerhead can have more than one zone from which the fluid is dispensed and to which the fluid mixture and flow rate can be independently controlled. Each zone can have more than one fluid distribution pathway to improve the uniformity of the fluid distribution within each zone. In addition, more than one upper layer of fluid distribution pathways above a lower layer of fluid distribution pathways can be provided to improve the uniformly with which the fluid is delivered to the lower level. During the thin film deposition or etching, the target film uniformity across the substrate can be maintained by adjusting the value of the one or more operating variables affecting the showerhead; the operating variables comprising chamber temperature in each zone, the fluid flow rate of input fluids to each zone in the showerhead, the composition of the input fluids to each zone, the chamber fluid pressure in each zone, ratio of fluid flowrate of a first exhaust port compared to a second exhaust port, the number of fluid pathways or number of fluid exit holes that are open in each zone, and/or the pressure of the fluid inside each zone of the showerhead.

Figure 8A:
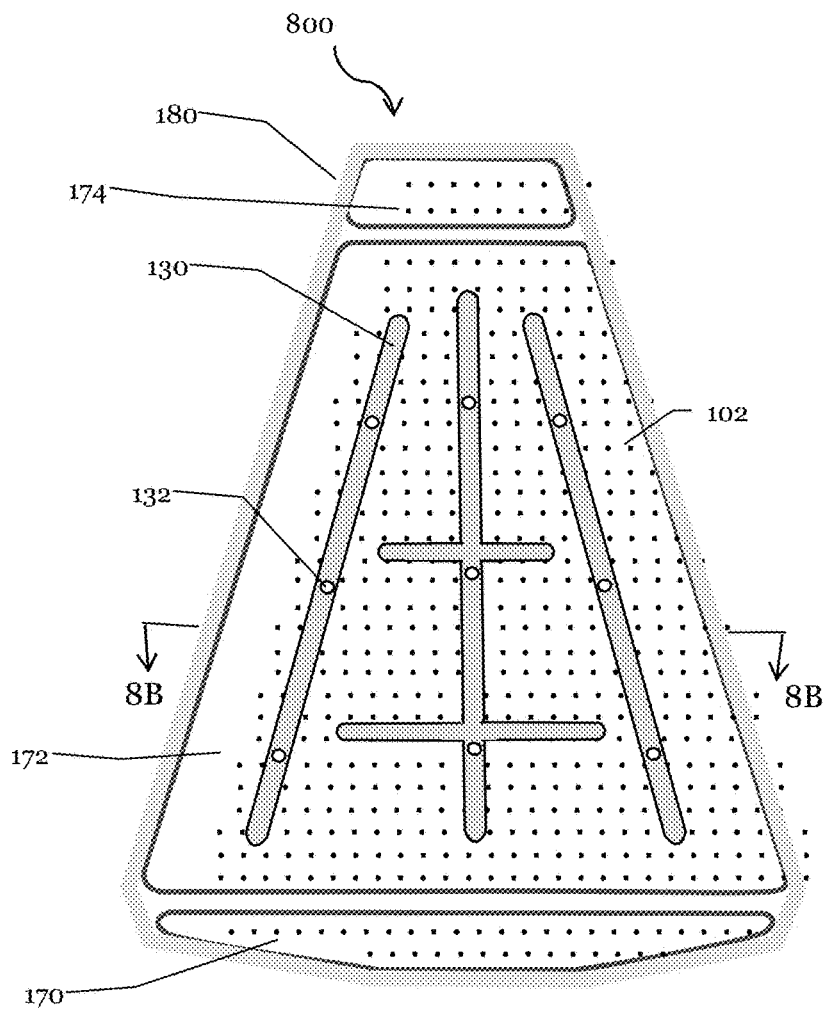
Figure 8B:
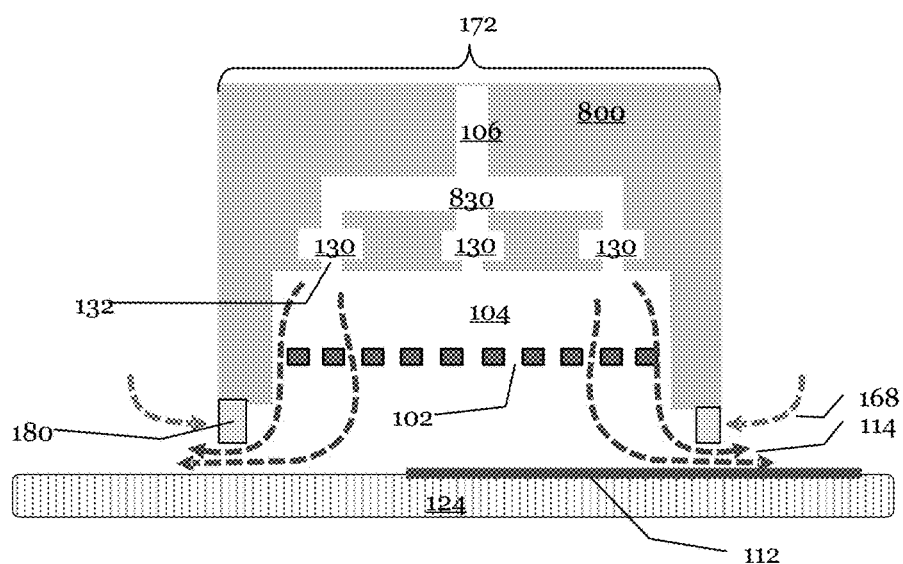

FIG. 8A is a wedge-shaped, multi-zone showerhead 800 with a skirt 180 in accordance with an embodiment, where FIG. 8A is top view and FIG. 8B is a cross sectional view of FIG. 8A.

Thin film deposition uniformity can be improved with the addition of a skirt 180 surrounding the fluid exit holes 102 and extending from the underside of the wedge-shaped showerhead 700 towards the substrate holder 124 as shown in FIGS. 8A and 8B. In an embodiment, the skirt 180 is shaped like a ring and fitted to the wedge-shaped showerhead 700. The skirt 180 may be machined from the same material billet as the showerhead, by simply recessing the central surface containing fluid injection holes 102. Ideally, in certain embodiments, it is preferred not to have skirt 180 and to place the showerhead surface with fluid holes 102 in close proximity (within 1 to 3 millimeters) to the substrate 124. However, this arrangement can lead to film thickness streaks on the substrate corresponding to the showerhead gas holes. The film thickness streaks can be avoided with the addition of the skirt 180 in certain embodiments. The skirt 180 also improves thin film composition uniformity especially near the periphery of the wedge-shaped showerhead 700 by reducing backflow of ambient nitrogen 168 under the edges of the wedge-shaped showerhead 700.

Figure 9:
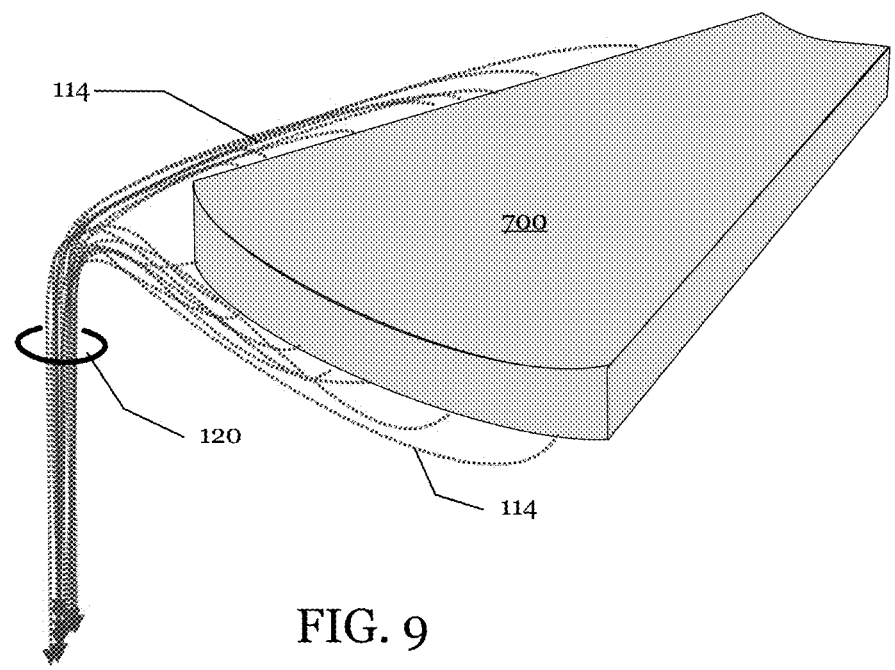
FIG. 9 is a projection view showing simulated fluid flow from under a wedge-shaped showerhead to a single exhaust port in a batch deposition or etching tool in accordance with an embodiment.

A length of the skirt 180 can have a range of about 1 mm to 10 mm. In various embodiments, a length of the skirt 180 can have a range of about 1 mm to 3 mm. In an example arrangement, the distance from the wedge-shaped showerhead 700 to the underlying substrate holder 124 is about 3 mm, the skirt 180 length is about 2 mm, and the distance from the skirt 180 to the substrate holder 124 is about 1.5 mm. These distances can be adjusted in accordance with the fluid flow to achieve best thin film uniformity. FIG. 9 is a projection view showing the simulated flow of the fluid 114 from under the wedge-shaped showerhead 700 to a single exhaust port 120 in a batch deposition or etching tool 122. Fluid 114 is dispensed from the fluid exit holes 102 on the underside of the wedge-shaped showerhead 700. This fluid 114 plus ambient nitrogen is pulled toward the single exhaust port 120. The fluid 114 flows non-uniformly across the underside of the wedge-shaped showerhead 700. The deposited thin film uniformity can be improved by improving the uniformity of flow of the fluid 114 across the underside of the wedge-shaped showerhead 700.

Figure 10:
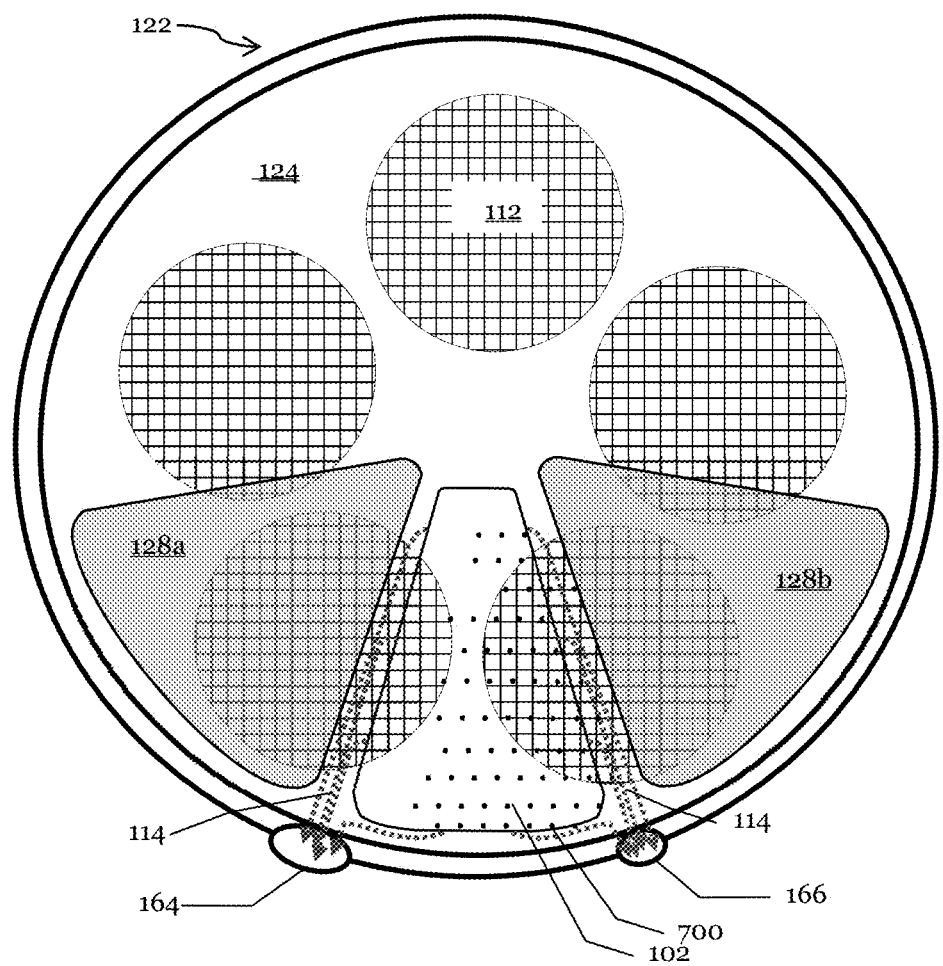
FIG. 10 is a top view of a batch deposition or etching tool with dual exhaust ports in accordance with an embodiment.

FIG. 10 is a top view of a batch deposition or etching tool 122 with dual exhaust ports 164 and 166. The batch deposition or etching tool 122 may be a CVD deposition tool in one embodiment, an ALD deposition tool in another, a fluid vapor etching tool in another, a plasma etching tool in another, and an ALE etching tool in yet another. A first exhaust port 164 and a second exhaust port 166 are positioned, one near each corner of the base of the wedge-shaped showerhead 700, to simultaneously evacuate fluid from both sides of the wedge-shaped showerhead 700. Instead of fluid flowing in one direction between the base of the wedge-shaped showerhead 700 and the substrate holder 124 on its way to a single exhaust port 120, with the first and second exhaust ports 164 and 166, the fluid 114 flows from both sides of the wedge-shaped showerhead 700 can be balanced improving uniformity of the depositing or etching thin film.

Figure 11:
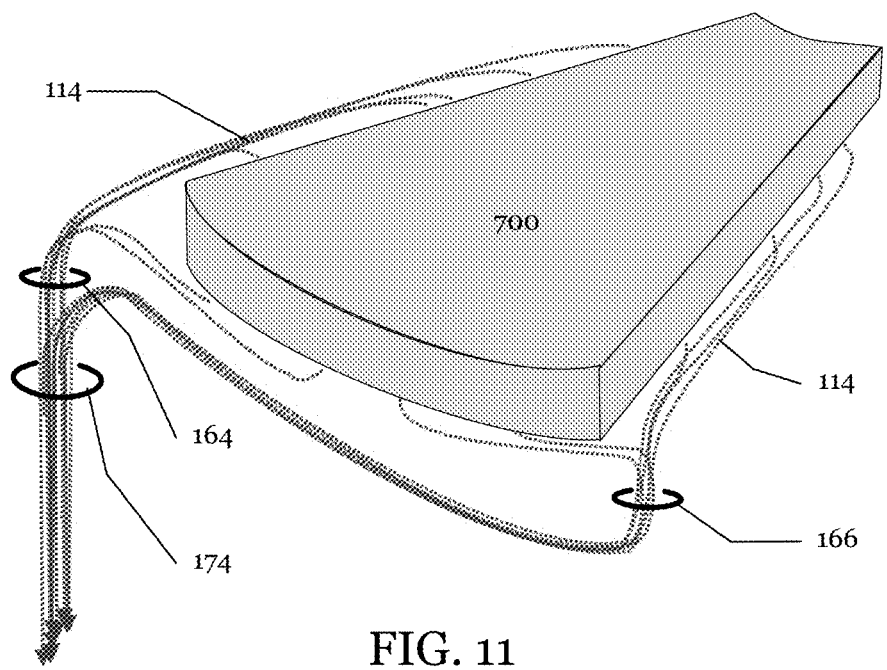
FIG. 11 is a projection view showing simulated flow from under a wedge-shaped showerhead to dual exhaust ports in a batch deposition or etching tool in accordance with an embodiment.

FIG. 11 is a projection view showing the simulated fluid flow from the wedge-shaped showerhead 700 to first and second exhaust ports 164 and 166. The first and second exhaust ports 164 and 166 are positioned near the corners of the base of the wedge-shaped showerhead 700. Fluid 114 is extracted from under the wedge-shaped showerhead 700 uniformly on both sides. The more uniform flow of the fluid 114 from between the substrate 112 and the wedge-shaped showerhead 700 produces a deposited or etched thin film with improved thin film uniformity. In FIG. 11, fluid 114 from the first gas channel between a first wedge-shaped inert gas showerhead 128a and along the first side of the wedge-shaped showerhead 700 enters the first exhaust port 164. Fluid 114 from the second gas channel between a second wedge-shaped inert gas showerhead 128b and along the second side of the wedge-shaped showerhead 700 enters the second exhaust port 166. Exhaust ports 164 and 166 differ in size because the two exhaust ports are connected with a passage. The conductance of this passage is important in determining the opening size for exhaust port 164. Exhaust port 166 is designed to be as large as can be accommodated, and then exhaust port 164 is sized to balance the flow. Exhaust port 164 is normally the standard exhaust outlet directly connected to the foreline and the vacuum pump. Therefore, a smaller opening for exhaust port 164 is required to balance the flow with port 166. The balanced removal of the fluid 114 and nitrogen from both sides of the wedge shaped showerhead 700 improves the uniformity of the fluid 114 flow under the wedge-shaped showerhead 700 improving the uniformity of the depositing or etching thin film.

Figure 12A:
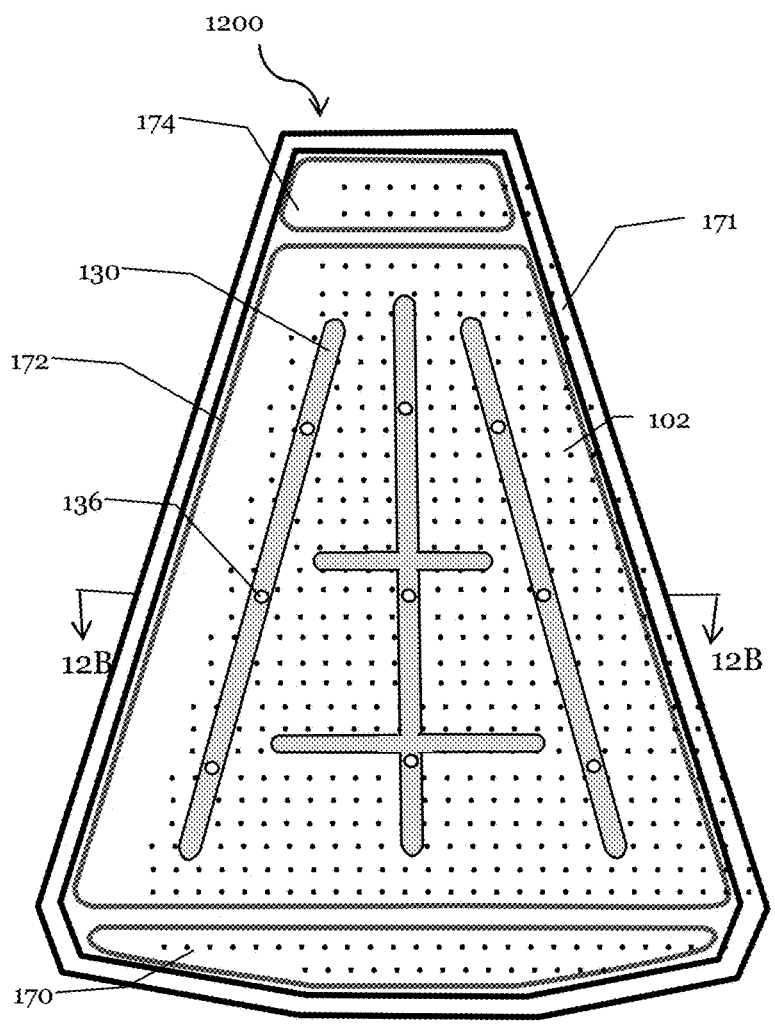
Figure 12B:
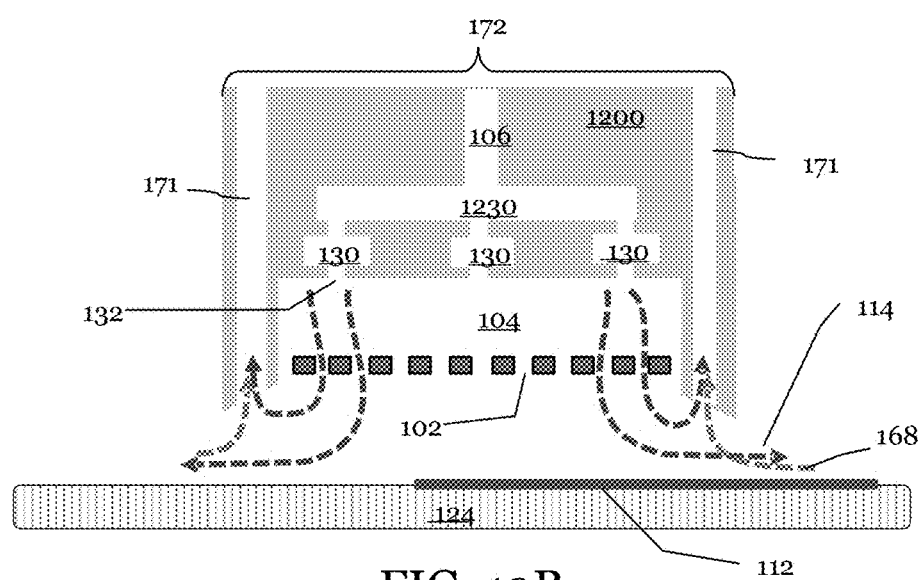

FIG. 12A is a wedge-shaped, multi-zone showerhead with a vacuum channel 171 in accordance with an embodiment, wherein FIG. 12A is a top view and FIG. 12B is a cross sectional view of FIG. 12A. This embodiment includes an additional vacuum channel 171 and may be combined with the embodiments described in FIG. 6A-6B, 7A-7B, 8A-8B, or 10.

In FIGS. 12A and 12B, thin film deposition or etching uniformity can be additionally improved with the addition of a vacuum channel 171 around the underside edge of the wedge-shaped multi-zone showerhead 1200. The vacuum channel openings face the substrate holder 124 and are aligned to remove fluid 114 and nitrogen 168 from between the wedge-shaped multi-zone showerhead 1200 and the underlying substrate holder 124. Removal of a substantial portion of the nitrogen 168 before it back diffuses under the edge of the wedge-shaped multi-zone showerhead 1200 reduces dilution of the fluid 114 in this region improving thin film deposition or etching uniformity. The vacuum channel 171 also provides more uniform removal of the fluid from between the wedge-shaped multi-zone showerhead 1200 and the substrate holder 124. The more uniform removal of the fluid after it is dispensed from the fluid exit holes 102 improves the uniformity of the flow of the fluid 114 under the wedge-shaped multi-zone showerhead 1200 enabling the more uniform deposition or etching of a thin film.

Figure 13A:
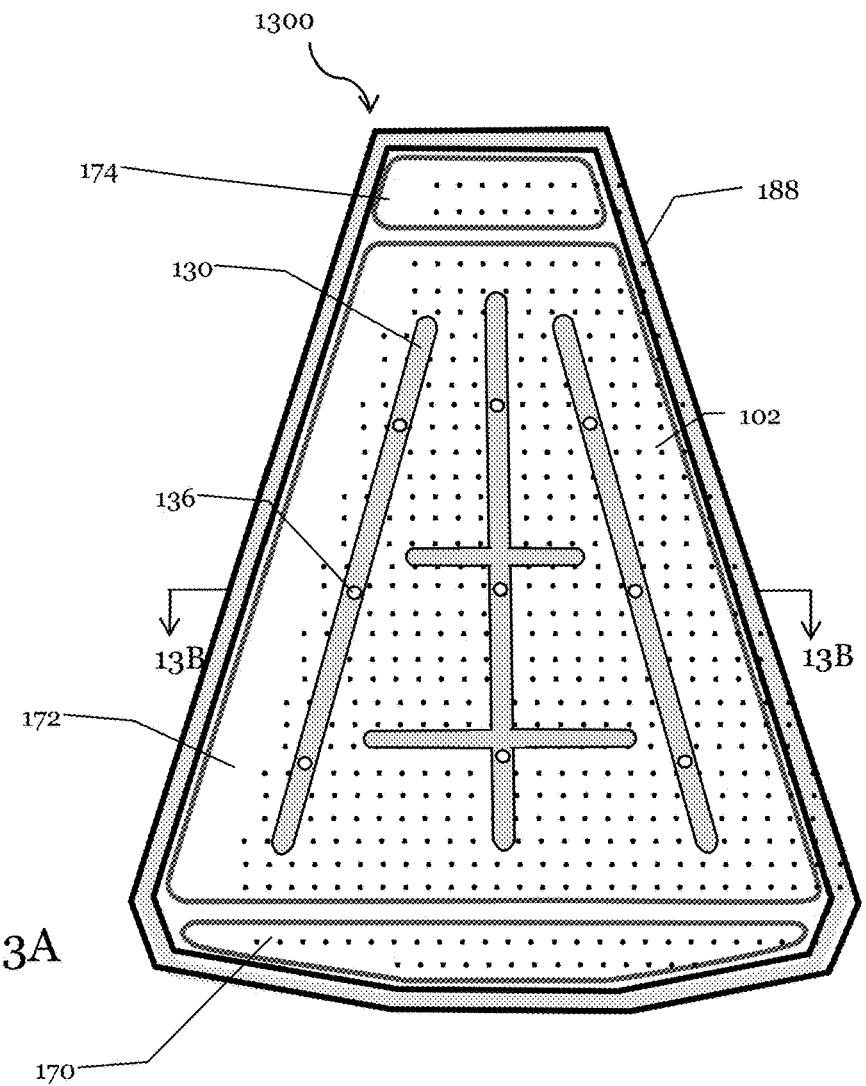
Figure 13B:
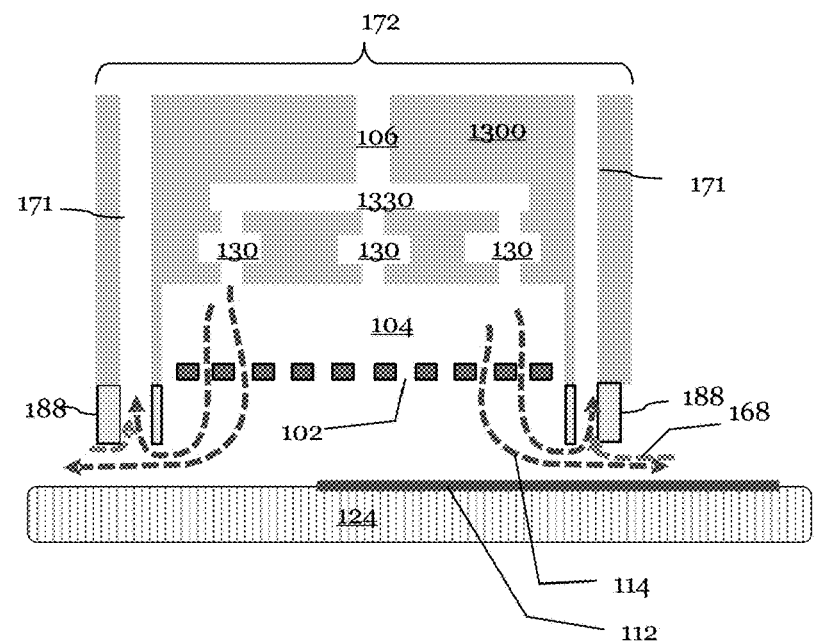

In an alternative embodiment illustrated in FIGS. 13A and 13B, the vacuum channel 171 may be incorporated into the skirt 180 forming an integrated skirt/vacuum channel 188. This reduces area and cost over the prior embodiment of having a separate vacuum channel 171 and skirt 180. FIG.

13A is a top view and FIG. 13B is a cross sectional view of FIG. 13A. In this embodiment, the skirt/vacuum channel 188 performs the dual functions of blocking nitrogen 168 back diffusion and also is the vacuum channel 171. In this arrangement, the skirt/vacuum channel 188 is hollow with openings arranged to remove fluid and nitrogen from between the substrate holder 124 and the underside of the showerhead 1300. By both blocking nitrogen 168 back diffusion, and evacuating a substantial amount of the nitrogen that does back diffuse, it reduces thin film non-uniformity at the borders of the shower-head 1300 as the result of fluid dilution with nitrogen. In addition, the skirt/vacuum channel 188 improves uniformity of the flow of the fluid between the showerhead 1300 and the substrate holder 124 by continuously removing fluid as it emerges from the fluid exit holes 102. More uniform fluid flow during deposition also improves thin film composition and more uniform fluid flow during deposition or etching improves thin film thickness uniformity.

In various embodiments, the thin film CVD deposition methods described in this disclosure are able to achieve more uniform thin film properties such as thickness and composition across the entire region over which the thin film is deposited and do it with reduced cost and reduced post-processing costs. In addition in various embodiments, the thin film etching methods described in this disclosure are able to achieve more uniform etched thin film thickness across the entire wafer and combined with reduced cost and reduced post-processing costs. The methods provided by the embodiments of the disclosure may include modifications to the fluid flow path, modifications to the showerhead and modifications to the vacuum exhaust system in the thin film deposition or etching tool. In an arrangement, a monolayer of silicon is deposited using a gas containing chlorosilane in an atomic layer deposition (ALD) tool. Chlorosilane containing gases include trichlorosilane ($SiCl_3H$, TCS), dichlorosilane ($SiCl_2H_2$, DCS), hexachlorodisilane ($Si_2Cl_6$, HCDS).

Figure 14:
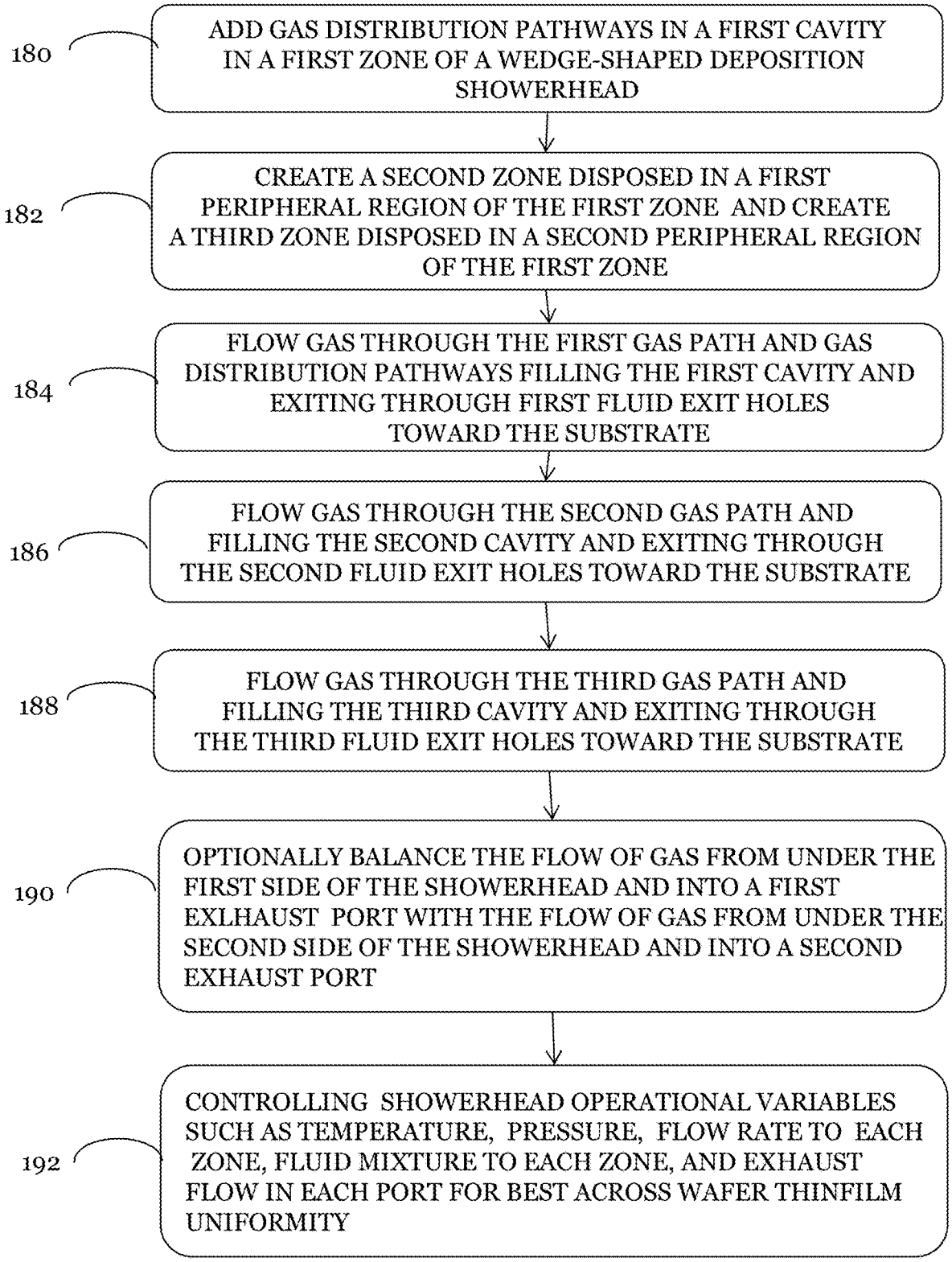
FIG. 14 is a flow diagram of process steps of a method in accordance with an embodiment describing deposition using a wedge-shaped showerhead with fluid distribution pathways.

The major steps in the method for depositing a CVD thin film or an ALD monolayer are listed in the flow diagram in FIG. 14.

The first method block 180 modifies the showerhead in the CVD or ALD tool to reduce the size of the first cavity in the showerhead and to include gas distribution channels with gas distribution holes to distribute the gas uniformly within the first cavity.

The second block 182 is to create a showerhead with multiple zones. In an example arrangement, an inner zone with a second cavity is disposed in a first peripheral region of the first zone and an outer zone with a third cavity is disposed in a second peripheral region of the first zone. A separate gas path with individual control of the gas flow is coupled between the gas source and the second zone and between the gas source and the third zone.

The third block 184 is to flow gas through the first gas path and through the gas distribution channels and gas distribution holes filling the first cavity and directing the gas to exit from the first cavity toward the substrate through the plurality of first gas exit holes.

The fourth block 186 is to flow gas through the second gas path filling the second cavity and directing the gas to exit from the second cavity toward the substrate through the plurality of second gas exit holes. Second distribution channels may be added to the second cavity if there is benefit. Typically the second cavity is smaller than the first cavity. The flow rate of the gas in the second zone may be adjusted differently than the flow rate in the first zone to improve CVD thin film or ALD monolayer uniformity. Usually the flow rate of the gas in the second outer zone is adjusted to be slightly higher than the flow rate in the first zone to counter nitrogen back diffusion and improve thin film uniformity.

The fifth block 188 is to flow gas through the third gas path filling the third cavity and directing the gas to exit from the third cavity toward the substrate through the plurality of third gas exit holes. Third gas distribution channels may be added to the third cavity if there is benefit. Typically the third cavity is smaller than the first cavity. The flow rate of the gas in the third zone may be adjusted differently than the flow rate in the first zone to improve CVD thin film or ALD monolayer uniformity. Usually the flow rate of the gas in the third zone is adjusted to be slightly higher than the flow rate in the first zone to counter nitrogen back diffusion for improved thin film uniformity.

The sixth block 190 can be optionally performed to improve thin film uniformity. In this method step a first vacuum port is positioned near the first corner of the base of the wedge-shaped showerhead and a second vacuum port is positioned near the second corner of the base. Valves in the vacuum lines to the vacuum ports are adjusted to balance the flow rate of the gas from under a first side of the wedge-shaped showerhead into the first vacuum port with the flow rate of the gas from under the second side of the wedge-shaped showerhead into the second vacuum port. The seventh block 192 is to control one or more operating variables of the showerhead, by adjusting a value of the one or more operating variables, the operating variables comprising chamber temperature, fluid flow rate of input fluids to each zone in the showerhead, the composition of the fluid flow to each zone in the showerhead, chamber fluid pressure in each zone, ratio of fluid flowrate of a first exhaust port compared to a second exhaust port, and number of fluid pathways or number of fluid exit holes that are open, and/or pressure of fluid inside each zone of the showerhead, the control of the one or more operating variables of the showerhead configured to maintain a target film uniformity of the substrate.

Accordingly, embodiments of the present disclosure enable uniform etching or deposition. Post deposition or post etch, metrology measurements are made across the wafer and correlation calculations are performed upon the data to determine if a statistically significant thickness pattern is present on the wafer. If a pattern is detected, adjustments to operating variables affecting the showerhead are made to eliminate the pattern. The operating variables including chamber temperature, local temperature of the fluid distribution pathways, fluid flow rate into each zone in the showerhead, chamber fluid pressure in each zone, ratio of fluid flowrate of a first exhaust port compared to a second exhaust port, and number of fluid pathways or number of fluid exit holes that are open, and/or pressure of fluid inside each zone of the showerhead. Accordingly, embodiments of the present invention include a process control scheme in which a first feature is formed by processing the substrate in a processing tool comprising the showerhead described above in various embodiments. The first feature may be a structure formed after an etching process or a deposition process, for example. The first feature is measured, for example, a surface roughness, critical dimension, or height of the first feature is measured using inline or other measurement tools including optical, electronic, or electromagnetic tools such as profilometer, scatterometer, electron microscope, x-ray, and others. Based on the measurement, it is determined whether the metric falls within a process window for the processing tool, for example, within a target for that process flow. If the metric falls outside the process window, a first flow rate of the first fluid to the first cavity, a second flow rate of the second fluid to the second cavity, a first fluid pressure in the first cavity, a second fluid pressure in the second cavity, an exhaust flow through an exhaust port of the processing tool, a first zone temperature in the first zone, or a second chamber temperature in the second zone is adjusted so that the metric in subsequent wafers can be brought within the target process window. Accordingly subsequent features are processed after the adjusting.

Example embodiments of the present application are summarized below. Other embodiments can also be understood from the entirety of the specification as well as the claims filed herein.

Example 1. An apparatus includes a processing chamber; a substrate holder disposed in the processing chamber; and a showerhead disposed over the substrate holder. The showerhead includes a first zone disposed in a central region of the showerhead, the first zone including a first cavity, a plurality of first fluid exit holes aligned to output a fluid from the first cavity towards the substrate holder, a first flow path fluidly coupled to a fluid source, and a plurality of first fluid distribution pathways fluidly coupling the first flow path with the first cavity.

Example 2. The apparatus of example 1, further including: a second zone disposed in a peripheral region of the showerhead, the second zone including a second cavity, a plurality of second fluid exit holes aligned to output the fluid from the second cavity towards the substrate holder, and a second flow path fluidly coupled to the fluid source and independent of the first flow path.

Example 3. The apparatus of one of examples 1 or 2, where the second zone further includes a plurality of second fluid distribution pathways fluidly coupling the second flow path with the second cavity.

Example 4. The apparatus of one of examples 1 to 3, further including: a skirt disposed around a border of the showerhead and extending towards the substrate holder.

Example 5. The apparatus of one of examples 1 to 4, where the skirt extends from the showerhead to a distance between 1 mm and 10 mm above the substrate holder.

Example 6. The apparatus of one of examples 1 to 5, where the skirt includes a vacuum channel disposed around a peripheral region of the showerhead with a plurality of fluid ingress holes aligned to input the fluid away from the substrate holder.

Example 7. The apparatus of one of examples 1 to 6, further including a vacuum channel disposed around a peripheral region of the showerhead with a plurality of fluid ingress holes aligned to input the fluid away from the substrate holder.

Example 8. The apparatus of one of examples 1 to 7, where the apparatus is an atomic layer deposition apparatus.

Example 9. An apparatus includes a processing chamber; a substrate holder disposed in the process chamber, where the substrate holder is configured to support a plurality of wafers; and a showerhead system disposed over the substrate holder. The showerhead system includes a wedge-shaped showerhead disposed around a central region of the processing chamber. The wedge-shaped showerhead includes a first cavity in a central zone of the wedge-shaped showerhead, a plurality of first fluid exit holes aligned to output a fluid from the first cavity towards the substrate holder, a plurality of fluid distribution pathways exiting into the first cavity, and a first flow path fluidly coupling a fluid source with the plurality of fluid distribution pathways.

Example 10. The apparatus of example 9, further including: a peripheral zone disposed in a peripheral region of the central zone, the peripheral zone including a second cavity, a plurality of second fluid exit holes aligned to output the fluid from the second cavity towards the substrate holder, and a second flow path fluidly coupled to the fluid source and independent of the first flow path.

Example 11. The apparatus of one of examples 9 or 10, further including: a skirt disposed around a border of the showerhead and extending towards the substrate holder.

Example 12. The apparatus of one of examples 9 to 11, where the skirt includes a vacuum channel disposed around a peripheral region of the showerhead with a plurality of fluid ingress holes aligned to input the fluid away from the substrate holder.

Example 13. The apparatus of one of examples 9 to 12, further including: a vacuum channel disposed around a border of the showerhead with a plurality of fluid ingress holes aligned to input the fluid away from the substrate holder.

Example 14. The apparatus of one of examples 9 to 13, the processing chamber further including: dual vacuum ports with a first vacuum port disposed near a first wide corner of the wedge-shaped showerhead and with a second vacuum port disposed near a second wide corner of the wedge-shaped showerhead.

Example 15. The apparatus of one of examples 9 to 14, where the apparatus is an atomic layer deposition apparatus.

Example 16. A method of processing a substrate includes flowing a gas through a showerhead towards the substrate. The showerhead includes a first zone disposed in a central region of the showerhead, the first zone including a first cavity, a plurality of first fluid exit holes aligned to output a fluid from the first cavity towards the substrate, a first flow path fluidly coupled to a fluid source, and a plurality of first fluid distribution pathways fluidly coupling the first flow path with the first cavity. The flowing includes filling the first cavity with the gas through the first flow path and the plurality of first fluid distribution pathways and directing the gas to exit from the first cavity through the plurality of first fluid exit holes.

Example 17. The method of example 16, further including: flowing the gas through a second zone in the showerhead towards the substrate, the second zone disposed in a peripheral region of the first zone, the second zone including a second cavity, a plurality of second fluid exit holes aligned to output the fluid from the second cavity towards the substrate, and a second flow path fluidly coupled to the fluid source and independent of the first flow path, where the flowing includes filling the second cavity with the gas through the second flow path and directing the gas to exit from the second cavity through the plurality of second fluid exit holes.

Example 18. The method of one of examples 16 or 17, where a flow rate of the gas exiting the second fluid exit holes is greater than a flow rate of the gas exiting the first fluid exit holes.

Example 19. The method of one of examples 16 to 18, where the showerhead is part of an atomic layer deposition tool, where the method further includes processing the substrate in the atomic layer deposition tool.

Example 20. The method of one of examples 16 to 19, where processing the substrate in the atomic layer deposition tool includes depositing an atomic layer of silicon and where the gas is a precursor gas containing chlorosilane.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus comprising:
   a processing chamber;
   a substrate holder disposed in the processing chamber; and
   a showerhead disposed over the substrate holder, the showerhead comprising a first zone disposed in a central region of the showerhead, the first zone comprising a first cavity, a plurality of first fluid exit holes aligned to output a fluid from the first cavity towards the substrate holder, a first flow path fluidly coupled to a first fluid source, and a plurality of first fluid distribution pathways fluidly coupling the first flow path with the first cavity, each of the first fluid distribution pathways comprising a mini cavity for storing the fluid, wherein the mini cavities are arranged in a first section oriented in a first direction and a second section oriented in a second direction, the second direction being orthogonal to the first section, the first section and the second section forming a warped cross shape in a top view.

2. The apparatus of claim 1, further comprising:
   a second zone disposed in a peripheral region of the showerhead, the second zone comprising a second cavity, a plurality of second fluid exit holes aligned to output the fluid from the second cavity towards the substrate holder, and a second flow path fluidly coupled to a second fluid source and independent of the first flow path.

3. The apparatus of claim 2, further comprising:
   a plurality of first cavities disposed in the first zone, and a respective plurality of first fluid exit holes aligned to output the fluid from each of the plurality of first cavities towards the substrate holder, a plurality of first flow paths fluidly coupled to the first fluid source, and one of a first plurality of fluid distribution pathways fluidly coupling each of the plurality of first flow paths with each of the plurality of first cavities; and
   a plurality of second cavities disposed in the second zone, a respective plurality of second fluid exit holes aligned to output the fluid from each of the plurality of second cavities towards the substrate holder, and a plurality of second flow paths fluidly coupled to the second fluid source and independent of the first flow path and the plurality of first flow paths.

4. The apparatus of claim 2, further comprising:
   a third zone disposed in an intermediate region of the showerhead, the intermediate region disposed between the central region and the peripheral region, the third zone comprising a third cavity, a plurality of third fluid exit holes aligned to output the fluid from the third cavity towards the substrate holder, and a third flow path fluidly coupled to a third fluid source and independent of the first flow path and the second flow path.

5. The apparatus of claim 2, wherein the second fluid source is the same as the first fluid source.

6. The apparatus of claim 2, wherein the second zone further comprises a plurality of second fluid distribution pathways fluidly coupling the second flow path with the second cavity.

7. The apparatus of claim 1, further comprising a skirt disposed around a border of the showerhead and extending towards the substrate holder.

8. The apparatus of claim 7, wherein the skirt extends from the showerhead to a distance between 1 mm and 10 mm above the substrate holder.

9. The apparatus of claim 7, wherein the skirt comprises a vacuum channel disposed around a peripheral region of the showerhead with a plurality of fluid ingress holes aligned to input the fluid away from the substrate holder.

10. The apparatus of claim 1, further comprising a vacuum channel disposed around a peripheral region of the showerhead with a plurality of fluid ingress holes aligned to input the fluid away from the substrate holder.

11. The apparatus of claim 1, wherein the apparatus is an atomic layer deposition apparatus.

12. An apparatus comprising:
    a processing chamber;
    a substrate holder disposed in the process chamber, the substrate holder being configured to support a plurality of wafers; and
    a showerhead system disposed over the substrate holder, the showerhead system comprising:
      a wedge-shaped showerhead disposed around a central region of the processing chamber, the wedge-shaped showerhead comprising:
        a first cavity in a central zone of the wedge-shaped showerhead,
        a plurality of first fluid exit holes aligned to output a fluid from the first cavity towards the substrate holder,
        a plurality of fluid distribution pathways exiting into the first cavity, each of the plurality of fluid distribution pathways comprising a respective mini cavity for storing the fluid, wherein the respective mini cavities are arranged in a first section oriented in a first direction and a second section oriented in a second direction, the second direction being orthogonal to the first section, the first section and the second section forming a warped cross shape in a top view, and
        a first flow path fluidly coupling a first fluid source with the plurality of fluid distribution pathways.

13. The apparatus of claim 12, further comprising:
    a peripheral zone disposed in a peripheral region of the central zone, the peripheral zone comprising a second cavity, a plurality of second fluid exit holes aligned to output the fluid from the second cavity towards the substrate holder, and a second flow path fluidly coupled to a second fluid source and independent of the first flow path.

14. The apparatus of claim 12, further comprising a skirt disposed around a border of the wedge-shaped showerhead and extending towards the substrate holder, wherein the skirt comprises a vacuum channel disposed around a peripheral region of the showerhead with a plurality of fluid ingress holes aligned to input the fluid away from the substrate holder.

15. The apparatus of claim 12, further comprising:
    a vacuum channel disposed around a border of the showerhead with a plurality of fluid ingress holes aligned to input the fluid away from the substrate holder.

16. The apparatus of claim 12, the processing chamber further comprising:
    dual vacuum ports with a first vacuum port disposed near a first wide corner of the wedge-shaped showerhead and with a second vacuum port disposed near a second wide corner of the wedge-shaped showerhead.

17. The apparatus of claim 12, wherein the apparatus is an atomic layer deposition apparatus.

18. An apparatus comprising:
a processing chamber;
a substrate holder disposed in the processing chamber; and
a showerhead disposed over the substrate holder, the showerhead comprising
a first flow path fluidly coupled to a first fluid source holding a first fluid,
a first plurality of mini cavities, each of the first plurality of mini cavities fluidly coupled to the first fluid source through the first flow path and configured to store the first fluid, the first plurality of mini cavities comprising a first section oriented in a first direction and a second section oriented in a second direction, the second direction being orthogonal to the first section, the first section and the second section forming a warped cross shape in a top view,
a first cavity, each of the first plurality of mini cavities comprising one of a first plurality of fluid distribution holes to output the first fluid into the first cavity, and
a plurality of first fluid exit holes aligned to output the first fluid from the first cavity towards the substrate holder.

19. The apparatus of claim 18, wherein the first plurality of mini cavities are different in size, wherein one of the first plurality of mini cavities in a central region of the showerhead is smaller than one of the first plurality of mini cavities in a peripheral region of the showerhead.

20. The apparatus of claim 18, wherein the showerhead is a wedge shaped showerhead.

21. The apparatus of claim 18, wherein the showerhead further comprises:
a second plurality of mini cavities, each of the second plurality of mini cavities fluidly coupled to the first fluid source through the first flow path and configured to store the first fluid, each of the first plurality of mini cavities being fluidly coupled to the first fluid source through one of the second plurality of mini cavities; and
each of the second plurality of mini cavities comprising one of a second plurality of fluid distribution holes to output the first fluid into the respective one of the first plurality of mini cavities to which it is coupled.

22. The apparatus of claim 18, wherein the showerhead further comprises:
an upper cavity fluidly coupled to the first fluid source through the first flow path and configured to store the first fluid, each of the first plurality of mini cavities being fluidly coupled to the first fluid source through the upper cavity.

23. The apparatus of claim 22, wherein the showerhead further comprises:
a second flow path fluidly coupled to a second fluid source holding a second fluid,
a second plurality of mini cavities, each of the second plurality of mini cavities fluidly coupled to the second fluid source through the second flow path and configured to store the second fluid,
a second cavity, each of the second plurality of mini cavities comprising one of a second plurality of fluid distribution holes to output the second fluid into the second cavity, and
a plurality of second fluid exit holes aligned to output the second fluid from the second cavity towards the substrate holder, the first cavity being positioned over a central region of the substrate holder and the second cavity being positioned over a peripheral region of the substrate holder.

24. The apparatus of claim 2, further comprising a microprocessor configured to independently control respective temperatures in the first zone and the second zone.

* * * * *